(12) United States Patent
Fujimoto et al.

(10) Patent No.: US 7,888,737 B2
(45) Date of Patent: Feb. 15, 2011

(54) SEMICONDUCTOR DEVICE AND METHOD OF MANUFACTURING THE SAME

(75) Inventors: Hiroyuki Fujimoto, Tokyo (JP); Yuki Togashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 206 days.

(21) Appl. No.: 12/360,165

(22) Filed: Jan. 27, 2009

(65) Prior Publication Data

US 2009/0212365 A1 Aug. 27, 2009

(30) Foreign Application Priority Data

Feb. 25, 2008 (JP) ............................. 2008-042560

(51) Int. Cl.
*H01L 27/12* (2006.01)

(52) U.S. Cl. ................. 257/347; 438/492; 438/672; 438/660; 438/661; 438/675; 257/E29.255; 257/E21.09

(58) Field of Classification Search ............... 438/492, 438/672, 660, 661, 675; 257/E29.255, E21.09, 257/347
See application file for complete search history.

(56) References Cited

U.S. PATENT DOCUMENTS

| | | | | |
|---|---|---|---|---|
| 5,661,057 A * | 8/1997 | Fujiwara | ................. | 438/257 |
| 5,930,675 A * | 7/1999 | Hada | ................. | 438/647 |
| 5,959,326 A * | 9/1999 | Aiso et al. | ................. | 257/306 |
| 5,960,285 A * | 9/1999 | Hong | ................. | 438/264 |
| 6,258,707 B1 * | 7/2001 | Uzoh | ................. | 438/618 |
| 6,268,281 B1 * | 7/2001 | Shih et al. | ................. | 438/629 |
| 6,396,078 B1 * | 5/2002 | Uochi et al. | ................. | 257/66 |
| 6,458,657 B1 * | 10/2002 | Chang | ................. | 438/257 |
| 6,844,259 B2 * | 1/2005 | Cheong | ................. | 438/657 |
| 6,893,957 B2 * | 5/2005 | Trivedi et al. | ................. | 438/632 |
| 7,049,230 B2 * | 5/2006 | Park | ................. | 438/672 |
| 7,483,246 B2 * | 1/2009 | Pinarbasi | ................. | 360/324.12 |
| 7,528,430 B2 * | 5/2009 | Chen et al. | ................. | 257/296 |
| 2003/0199151 A1 * | 10/2003 | Ho et al. | ................. | 438/437 |
| 2004/0095691 A1 * | 5/2004 | Lin et al. | ................. | 360/324.1 |
| 2005/0017325 A1 * | 1/2005 | Gris | ................. | 257/552 |
| 2005/0068696 A1 * | 3/2005 | Chau et al. | ................. | 360/324.12 |
| 2005/0112870 A1 * | 5/2005 | Park | ................. | 438/647 |
| 2006/0160363 A1 * | 7/2006 | Furukawa et al. | ................. | 438/704 |

FOREIGN PATENT DOCUMENTS

| | | |
|---|---|---|
| JP | 63-172457 | 7/1988 |
| JP | 2003-338542 | 11/2003 |
| WO | WO 98/58408 | 12/1998 |

\* cited by examiner

*Primary Examiner*—Fernando L Toledo
*Assistant Examiner*—Ankush K Singal
(74) *Attorney, Agent, or Firm*—Young & Thompson

(57) ABSTRACT

A semiconductor device includes: a monocrystalline substrate; an inter-layer film formed on the monocrystalline substrate; a contact hole penetrating the inter-layer film and partially exposing an upper surface of the monocrystalline substrate; a sidewall formed on an inner surface of the contact hole; a plurality of first monocrystalline layers which include few defects, fill the contact hole, and cover the inter-layer film; and a plurality of second monocrystalline layers which include many defects and cover the sidewall and an upper surface of the inter-layer film so as to be sandwiched between the first monocrystalline layers and the inter-layer film.

20 Claims, 21 Drawing Sheets

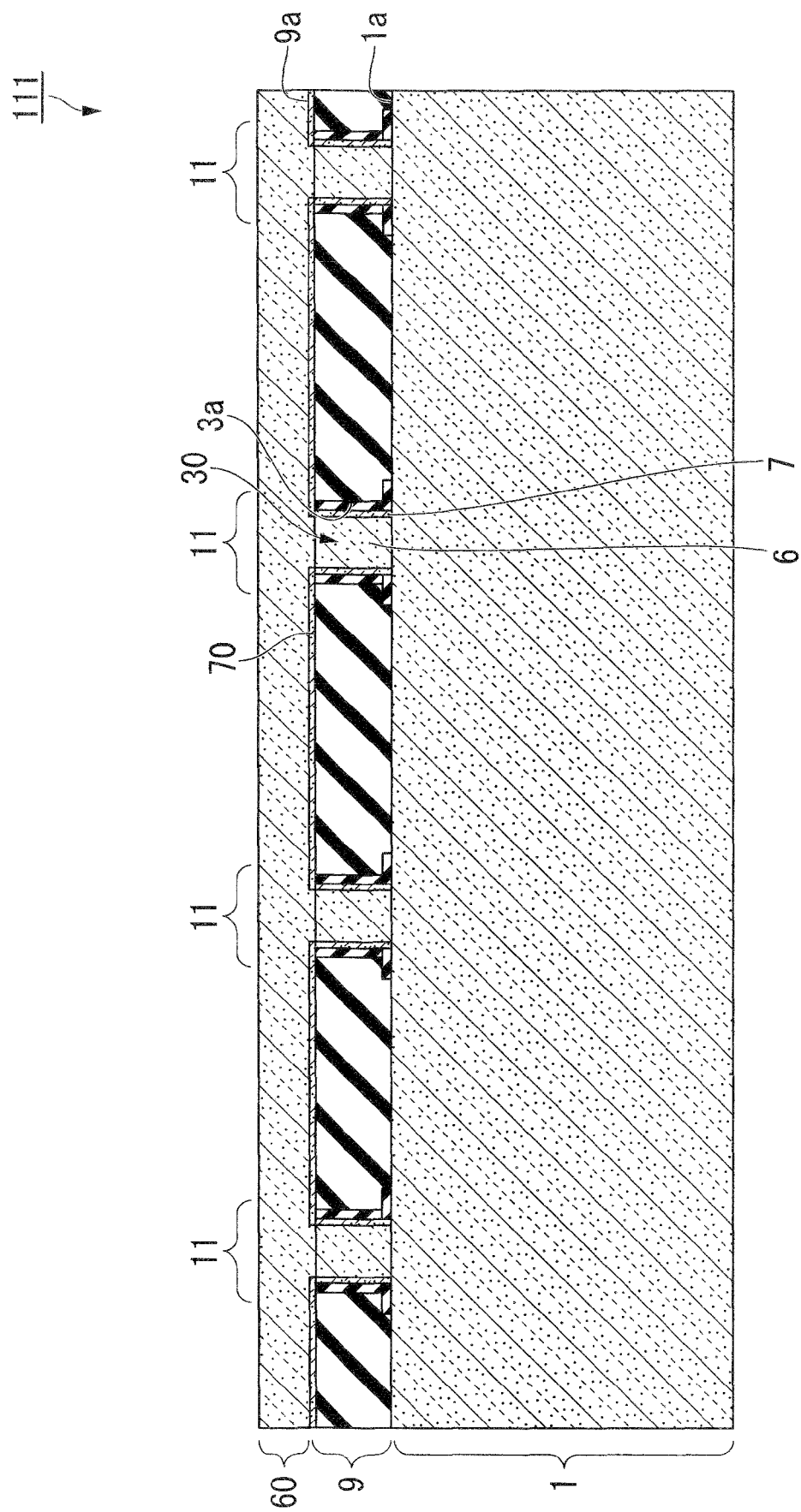

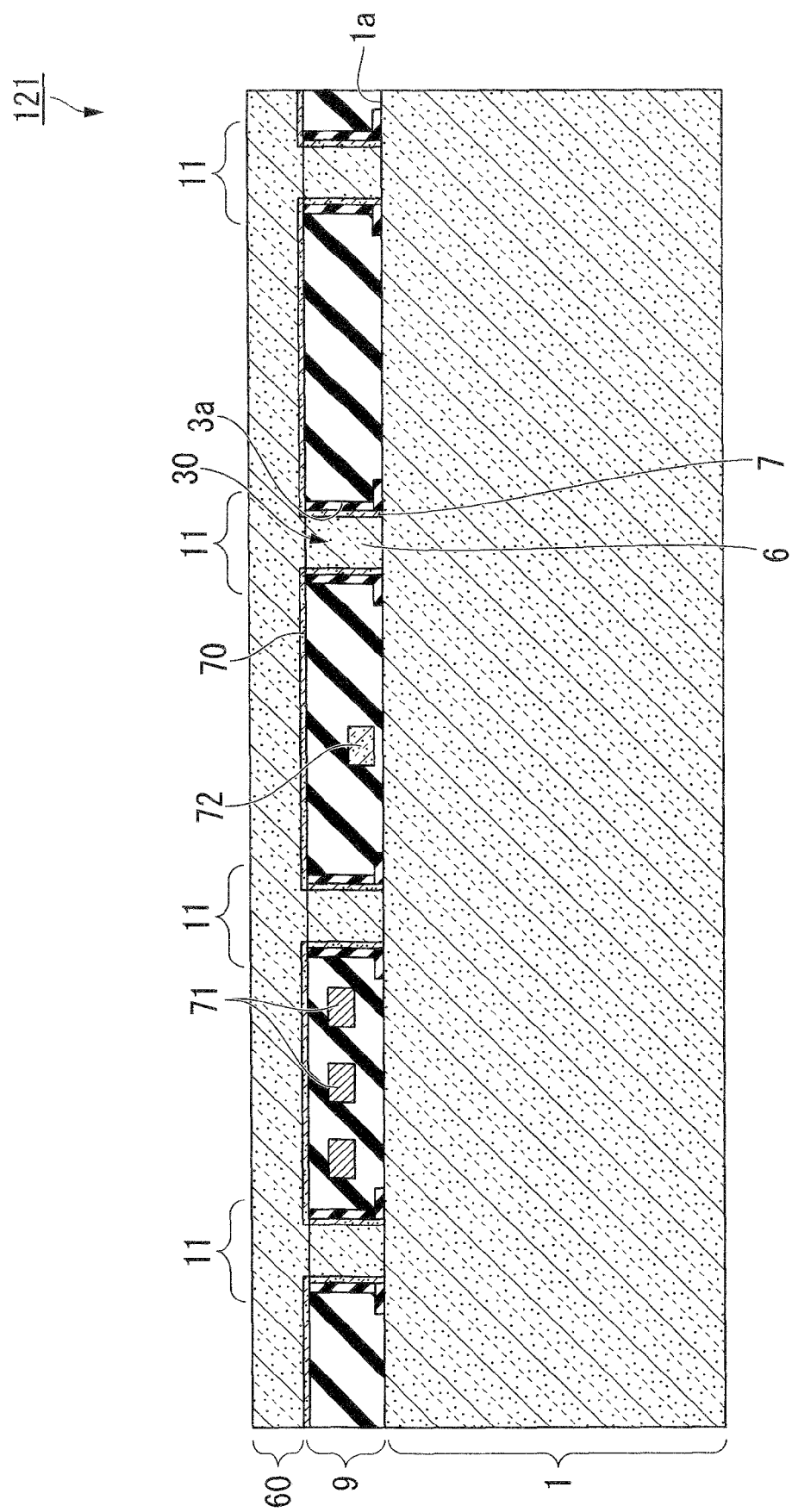

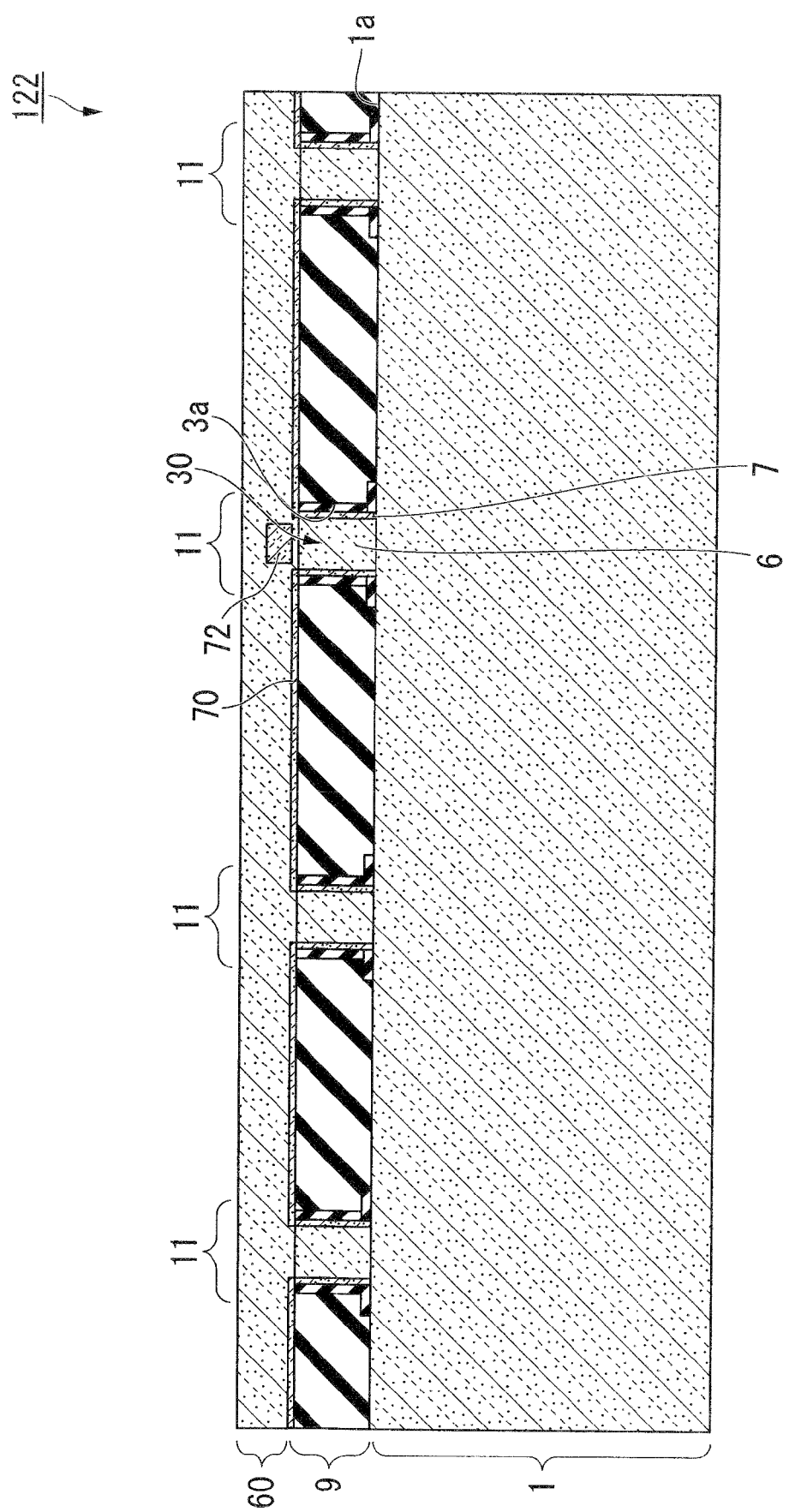

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same.

Priority is claimed on Japanese Patent Application No. 2008-042560, filed Feb. 25, 2008, the content of which is incorporated herein by reference.

2. Description of the Related Art

Recently, multilayering has been proposed with the demand for higher-density semiconductor devices. The multilayering includes forming, on a monocrystalline substrate, multiple SOI (silicon on insulator) layers each including an insulating film and a silicon layer formed on the insulating film. Since a circuit is formed in each silicon layer, each silicon layer needs to be formed as a monocrystalline substrate having few defects. Conventionally, contact holes are formed in an insulating film, followed by forming a first monocrystalline layer by epitaxial growth from the monocrystalline substrate in the contact holes. Then, a second monocrystalline layer is further formed over the insulating film and the first monocrystalline layer with the first monocrystalline layer as a seed layer.

PCT International Publication No. WO98-058408, and Japanese Patent, Laid-open Publication Nos. 2003-338542 and S63-172457 disclose epitaxial growth technologies of monocrystalline silicon layers.

FIGS. 32A to 34 are cross-sectional views indicative of process flow illustrating a method of manufacturing a conventional SOI substrate. FIG. 32A is a plane view illustrating a state when a circular contact hole 30 is formed in a silicon oxide film 3. FIG. 32B is a cross-sectional view taken along a line E-E' shown in FIG. 32A.

As shown in FIGS. 32A and 32B, the contact hole 30 penetrates a silicon nitride film 2 and the silicon oxide film 3 sequentially formed on a monocrystalline silicon substrate 1. A sidewall 4 made of a silicon nitride film is formed on an inner surface 3a of the contact hole 30. The upper surface of the monocrystalline silicon substrate 1 is partially exposed to the contact hole 30.

The contact hole 30 is formed by: sequentially forming the silicon nitride film 2 and the silicon oxide film 3 on the monocrystalline silicon substrate 1; etching the silicon oxide film 3 by lithography and dry etching so that the silicon nitride film 2 is partially exposed; forming a silicon nitride film over the entire surface; and etching the silicon nitride film by dry etching so that the upper surface of the monocrystalline silicon substrate 1 is partially exposed. At this time, the sidewall 4 is formed on the inner surface 3a of the contact hole 30.

Then, a monocrystalline silicon layer is formed in the contact hole 30 by epitaxial growth. In this case, lattice mismatch does not occur between the monocrystalline silicon substrate 1 and the monocrystalline silicon layer. Thereby, a monocrystalline silicon layer 16 having few defects can be formed.

However, the sidewall 4 made of a silicon nitride film is formed on the inner surface 3a, and therefore lattice mismatch occurs between the silicon nitride film and the monocrystalline silicon layer. Accordingly, the monocrystalline silicon layer that has grown in contact with the silicon nitride film includes many defects which spread. Thereby, a monocrystalline silicon layer 17 having many defects is formed.

As a result, the monocrystalline silicon layers formed in the contact hole 30 includes the monocrystalline silicon layer 16 having few defects and the monocrystalline silicon layer 17 having many defects as shown in FIG. 33

Then, a monocrystalline silicon layer 18 covering the silicon oxide film 3 is formed by continuing the epitaxial growth with a portion of the monocrystalline silicon layer 17 protruding from the silicon oxide film 3 as a seed layer. Thereby, the monocrystalline silicon layer 18 is an SOI layer.

However, the monocrystalline silicon layer 18 is formed by the epitaxial growth with the monocrystalline silicon layer 17 having many defects as a seed layer. Therefore, the monocrystalline silicon layer 18 includes many defects and cannot be a SOI layer having few defects.

In the conventional epitaxial growth method, a surface toward which a monocrystalline silicon layer is not to be grown needs to be masked by an insulating film. Since lattice mismatch necessarily occurs between the insulating film and the monocrystalline silicon layer, the grown monocrystalline silicon layer necessarily includes many defects.

When a silicon oxide film is used as an insulating film, lattice mismatch occurs, and therefore the grown monocrystalline silicon layer includes many defects similarly to when a silicon nitride film is used as an insulting film.

When a semiconductor element, such as a transistor, is formed in an SOI layer including a monocrystalline layer having many defects, many problems arise such as that a leakage current (such as a junction leakage) cannot be reduced, degrading the reliability of a semiconductor device.

SUMMARY

In one embodiment, there is provided a semiconductor device which may include: a monocrystalline substrate; an inter-layer film formed on the monocrystalline substrate; a contact hole penetrating the inter-layer film and partially exposing an upper surface of the monocrystalline substrate; a sidewall formed on an inner surface of the contact hole; and a plurality of first and second monocrystalline layers The first monocrystalline layers include few defects, fill the contact hole, and cover the inter-layer film. The second monocrystalline layers include many defects and cover the sidewall and an upper surface of the inter-layer film so as to be sandwiched between the first monocrystalline layers and the inter-layer film.

In another embodiment, there is provided a method of manufacturing a semiconductor device which may include the following processes. A monocrystalline substrate is formed. Then, an inter-layer film is formed on the monocrystalline substrate. Then, a contact hole is formed to penetrate the inter-layer film and partially expose an upper surface of the monocrystalline substrate. Then, a first sidewall is formed to cover an inner surface of the contact hole. Then, a second sidewall is formed to cover the first sidewall. Then, a first monocrystalline layer including few defects is formed on the partially-exposed upper surface of the monocrystalline substrate by epitaxial growth. Then, a portion of the second sidewall in contact with the monocrystalline substrate and the first monocrystalline layer is removed by annealing in a reduced atmosphere. Then, the epitaxial growth and the annealing are repeated in this order multiple times to form a plurality of first monocrystalline layers filling the contact hole and covering the inter-layer film, and a plurality of second monocrystalline layers including many defects and covering the first sidewall and an upper surface of the inter-layer film so as to be sandwiched between the first monocrystalline layers and the inter-layer film. The second sidewall is removed and replaced with the second monocrystalline layers.

According to the semiconductor device and the method of manufacturing the same, defects of the multilayered monocrystalline layers can be reduced. Therefore, electronic characteristics of the semiconductor device can be stabilized and the reliability thereof can be enhanced.

BRIEF DESCRIPTION OF THE DRAWINGS

The above features and advantages of the present invention will be more apparent from the following description of certain preferred embodiments taken in conjunction with the accompanying drawings, in which:

FIG. 27 illustrates the semiconductor device according to the first embodiment;

FIG. 28 illustrates a semiconductor device according to an eighth embodiment of the present invention;

FIG. 29 illustrates a semiconductor device according to a ninth embodiment of the present invention;

DETAILED DESCRIPTION OF THE PREFERRED EMBODIMENTS

Figure 1:
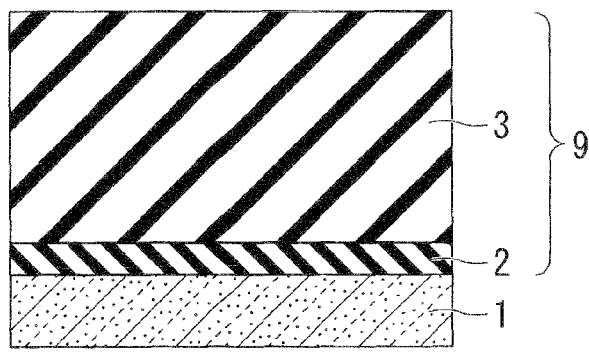
FIGS. 1 to 15 illustrate process flow of a method of manufacturing a semiconductor device according to a first embodiment of the present invention.

The invention will now be described herein with reference to illustrative embodiments. Those skilled in the art will recognize that many alternative embodiments can be accomplished using the teachings of the present invention and that the invention is not limited to the embodiments illustrated herein for explanatory purposes.

First Embodiment

Hereinafter, a first embodiment of the present invention is explained.

FIG. 27 is a cross-sectional view illustrating a semiconductor device according to the first embodiment. A substrate 111 of the semiconductor device according to the first embodiment includes an inter-layer film 9, a monocrystalline layer 70 including many defects, and a monocrystalline layer 60 including fewer defects than the monocrystalline layer 70 which are sequentially deposited, and multiple contacts 11 separately formed in the insulating layer 9.

The contact 11 includes the inter-layer film 9 formed on the monocrystalline substrate 1, the monocrystalline layer having many defects 7 formed on the inner surfaces 3a of the contact holes 30 partially exposing the upper surface 1a of the monocrystalline substrate 1, the monocrystalline layers having few defects 6 formed by epitaxial growth to fill the contact holes 30, the monocrystalline layer having many defects 70 formed on the inter-layer film 9, and a monocrystalline layer having few defects 60 epitaxially grown on the monocrystalline layer having many defects 70 so as to be in contact with the monocrystalline layer having few defects 6.

Figure 15:
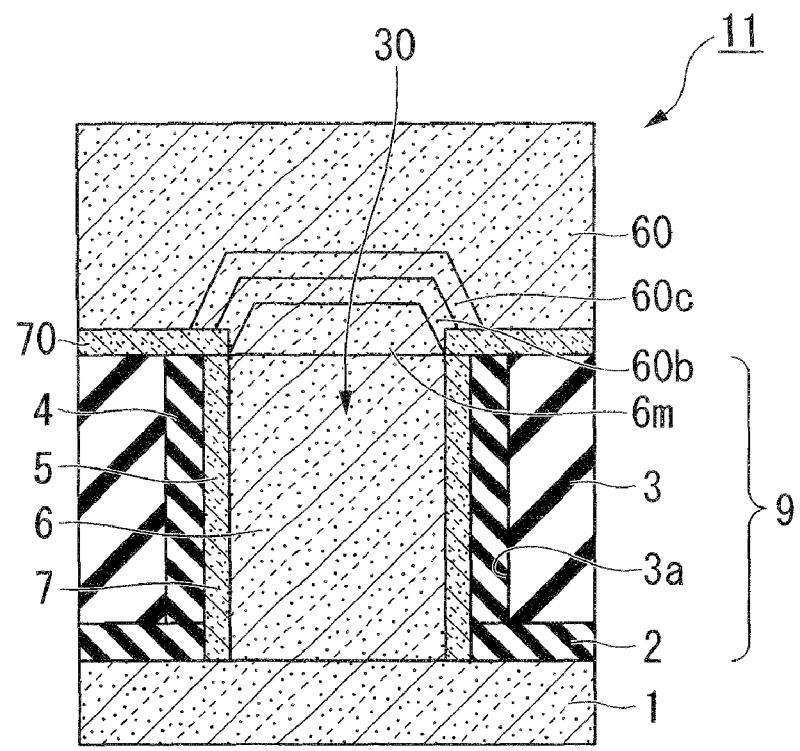

FIG. 15 is a partially enlarged view illustrating the contact 11 shown FIG. 27.

The contact 11 includes the inter-layer film 9, the monocrystalline layer having many defects 70, and the monocrystalline layer having few defects 60 which are sequentially formed on the monocrystalline substrate 1 such that the monocrystalline layer having few defects 6 fills the contact hole 30 penetrating the monocrystalline layer having many defects 70 and the inter-layer film 9. The contact 11 connects the monocrystalline substrate 1 and the monocrystalline layer having few defects 60.

The inter-layer film 9 includes a nitride film 2 and an oxide film 3. Since the inter-layer film 9 includes an insulating film, the substrate 111 can be used as an SOI substrate.

Monocrystalline layers 6m, 60b, and 60c epitaxially grown from the monocrystalline layer having few defects 6 are shown in the monocrystalline layer having few defects 60. The sidewall 4 is formed on the inner surface 3a of the contact hole 30. The monocrystalline layer of many defects 7 is formed to cover the sidewall 4. The monocrystalline layer having few defects 6 is formed on the exposed surface 1a of the monocrystalline substrate 1 to fill the contact hole 30.

The monocrystalline layer 6 includes few defects, and therefore can be used as the contact 11 connecting the monocrystalline substrate 1 and the monocrystalline layer having few defects 60. The monocrystalline layer 60 also includes few defects, and therefore a semiconductor element, such as a transistor, can be formed therein.

According to the first embodiment, the substrate 111 includes the monocrystalline layer having few defects 6 and the monocrystalline layer having many defects 7, enabling stabilization of electronic characteristics and enhancement of the reliability.

Hereinafter, a method of manufacturing the semiconductor device according to the first embodiment is explained.

As shown in FIG. 1, the silicon nitride film 2 having a thickness of, for example, 10 nm is deposited on the monocrystalline substrate 1 made of silicon by CVD (Chemical Vapor Deposition). Then, the silicon oxide film 3 having a thickness of, for example, 200 nm is deposited by CVD on the silicon nitride film 2.

Figure 2A:
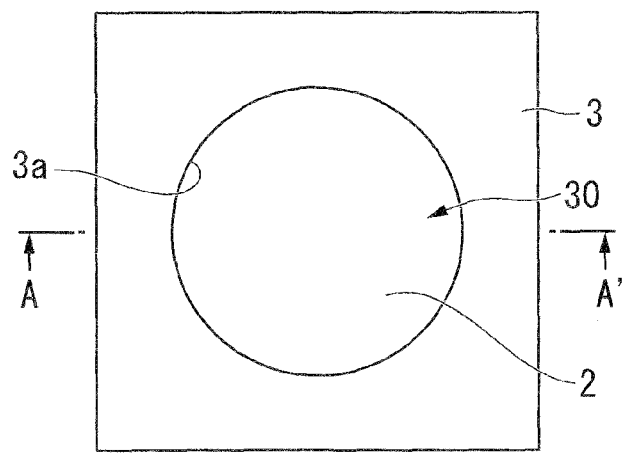

Then, a patterned photoresist film including circular holes is formed on the silicon oxide film 3 by lithography. The circular contact hole 30 is formed in the silicon oxide film 3 by anisotropic dry etching with the photoresist film as a mask as shown in FIG. 2A. As a result, the silicon nitride film 2 is partially exposed to the contact hole 30.

Figure 2B:
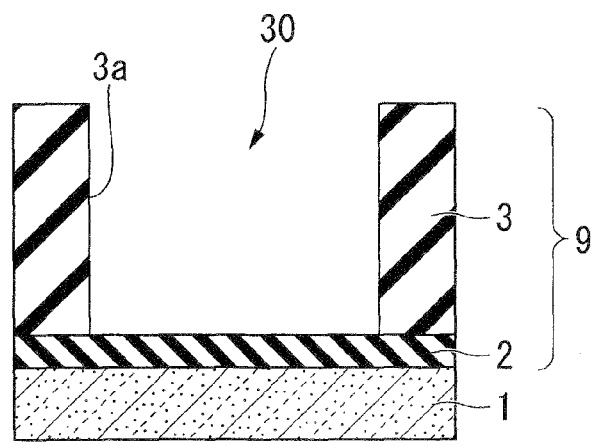

FIG. 2B is a cross-sectional view taken along a line A-A' shown in FIG. 2A. The inner surface 3a of the contact hole 30 is formed to be substantially perpendicular to the monocrystalline substrate 1 made of silicon.

Figure 3:
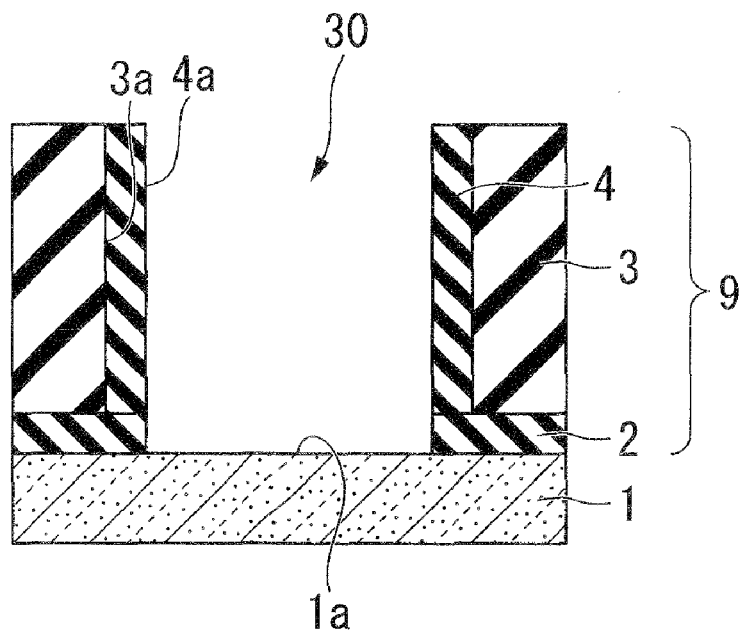

Then, a silicon nitride film having a thickness of, for example, 10 nm is deposited by CVD over the entire surface, followed by dry-etching the silicon nitride film to form the sidewall 4 on the inner surface 3a as shown in FIG. 3. As a result, the upper surface 1a of the monocrystalline substrate 1 is partially exposed to the contact hole 30.

The sidewall 4 is formed to prevent the shape of the contact hole 30 from changing by a substitutional sidewall 5 made of a silicon oxide film being etched. The change in the shape of the contact hole 30 is not problematic when the diameter of the contact hole 30 is large, but may be a factor causing various problems when the diameter is small.

Figure 4:
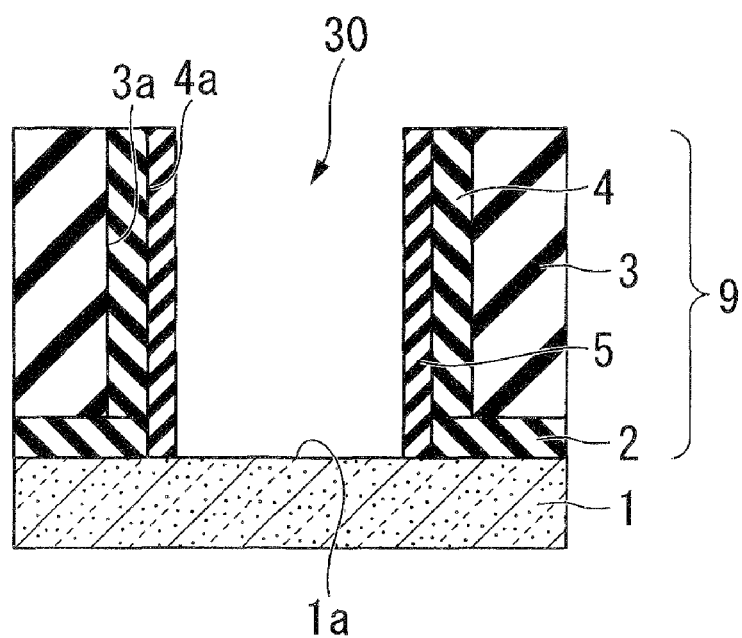

Then, a silicon oxide film having a thickness of, for example, 10 nm is deposited over the entire surface by CVD, followed by dry-etching the silicon oxide film to form the substitutional sidewall 5 made of the silicon oxide film on the inner surface 4a of the sidewall 4, as shown in FIG. 4. As a result, the upper surface 1a of the monocrystalline substrate 1 is partially exposed to the contact hole 30.

Then, the exposed surface 1a of the monocrystalline substrate 1 is cleansed by, for example, a wet process such as organic solvent cleaning or a dry process such as ozone cleaning.

Figure 5:
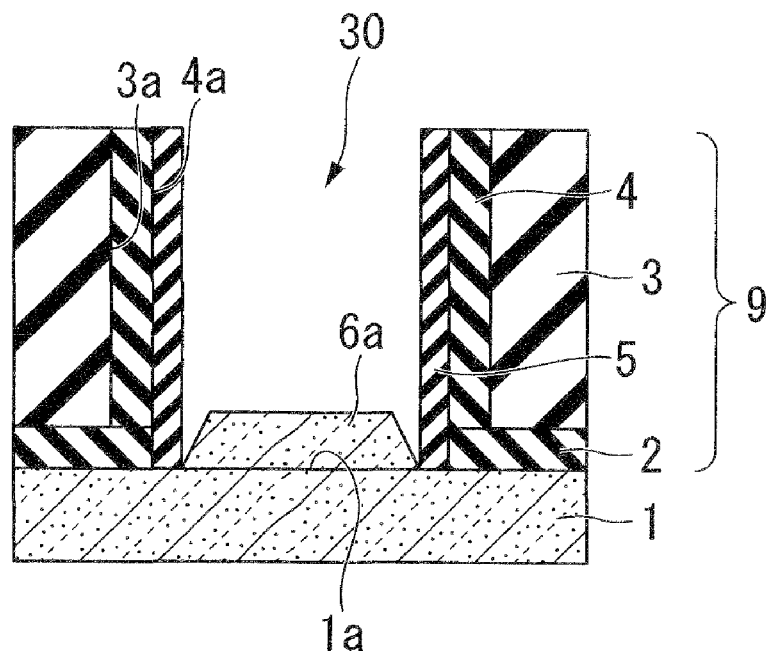
Figure 6:
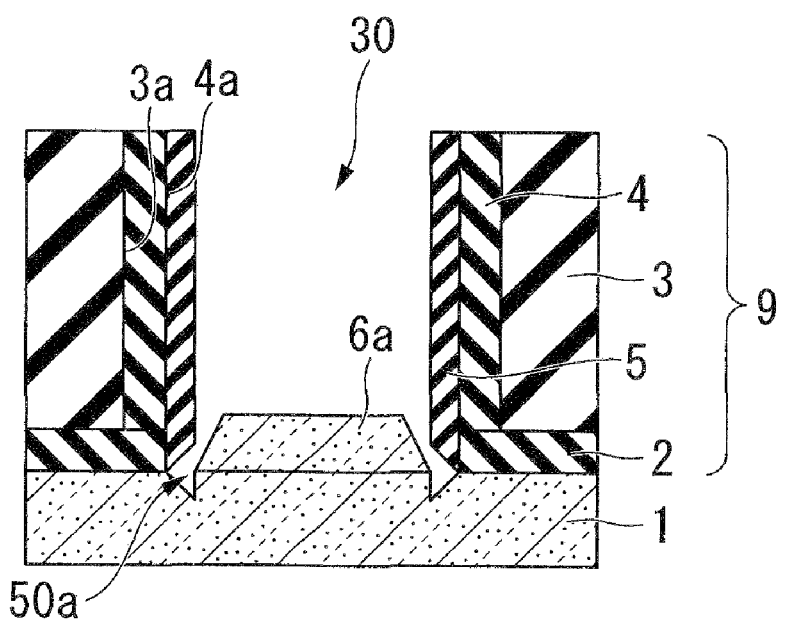
Figure 7:
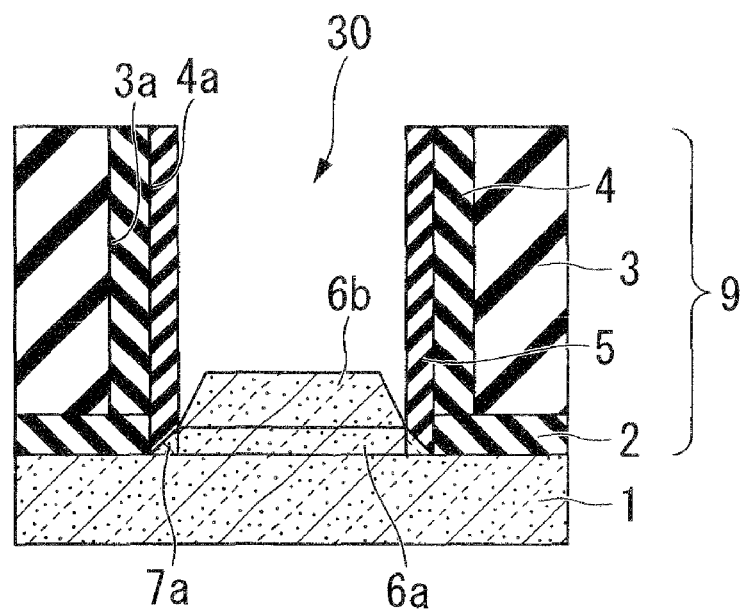

Then, the monocrystalline layer 6a made of silicon is formed on the exposed surface 1a of the monocrystalline substrate 1 by epitaxial growth using an epitaxial growth apparatus, as shown in FIG. 5. The epitaxial growth is carried out at 800° C. in a hydrogenous atmosphere with dichlorosilane supplied at 200 cc/min and hydrogen chloride supplied at 100 cc/min. The hydrogenous atmospheric pressure may be smaller than atmospheric pressure.

The monocrystalline layer 6a is preferably formed such that side portions thereof in contact with the substitutional sidewall 5 are as small as possible. If the contact portions are small, lattice mismatch between the monocrystalline layer 6a and the substitutional sidewall 5 does not have a significant effect, preventing defects of the monocrystalline layer 6a. If the contact portions are large, lattice mismatch therebetween have a large effect, causing many defects in the monocrystalline layer 6a.

Then, the supply of the material gas for the epitaxial growth is terminated, followed by annealing in a reduced atmosphere. As a result, contact portions between the monocrystalline substrate 1 and the substitutional sidewall 5 are removed, thereby forming a pit 50a.

The annealing can be carried out in, for example, a 100% hydrogen atmosphere. By the contact boundary between the silicon oxide film and the silicon being subjected to annealing in a hydrogen atmosphere at equal to or more than 750° C., the silicon oxide film and the silicon at the contact portions are etched.

Specifically, a thermal treatment, such as annealing in a reduced atmosphere, is carried out while silicon dioxide ($SiO_2$) and silicon (Si) contact each other. Thereby, one of two oxygen atoms reacts with silicon, then the silicon around the contact boundary can be removed as SiO which can sublimate, and farther the silicon dioxide with one oxygen atom removed can also be removed as SiO.

By the use of annealing in a reduced atmosphere, a monocrystalline layer having many defects formed at the boundary portion between the monocrystalline layer and the silicon oxide film is removed at each step of annealing in the reduced atmosphere, preventing defects from spreading.

Then, material gas is resupplied to form monocrystalline layers 6b and 7a epitaxially grown respectively on the monocrystalline layer 6a and the pit 50a. The monocrystalline layer 7a epitaxially grown on the pit 50a contacts the substitutional sidewall 5, and thereby includes many defects. On the other hand, the monocrystalline layer 6b epitaxially grown on the monocrystalline layer having few defects 6a includes few defects.

Figure 8:
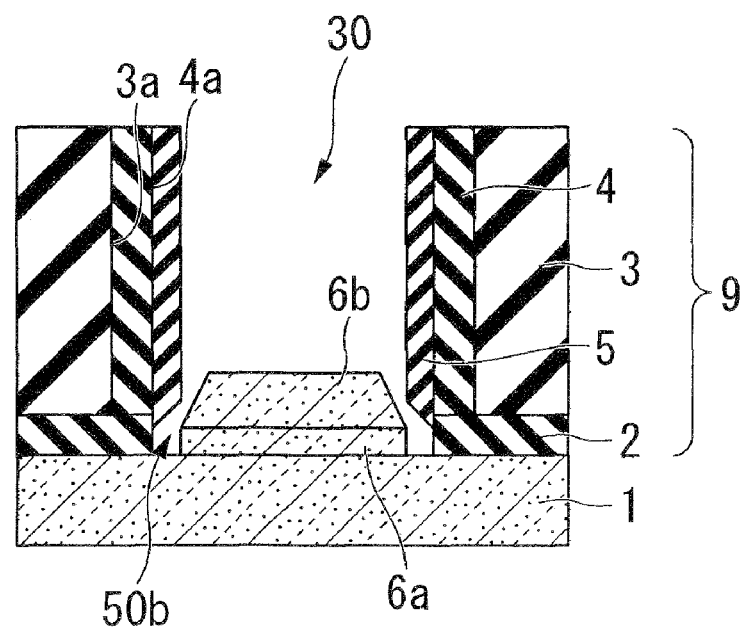

Then, the resupply of material gas is terminated, followed by annealing in a hydrogen atmosphere under the aforementioned conditions to form a new pit 50b as shown in FIG. 8.

Figure 9:
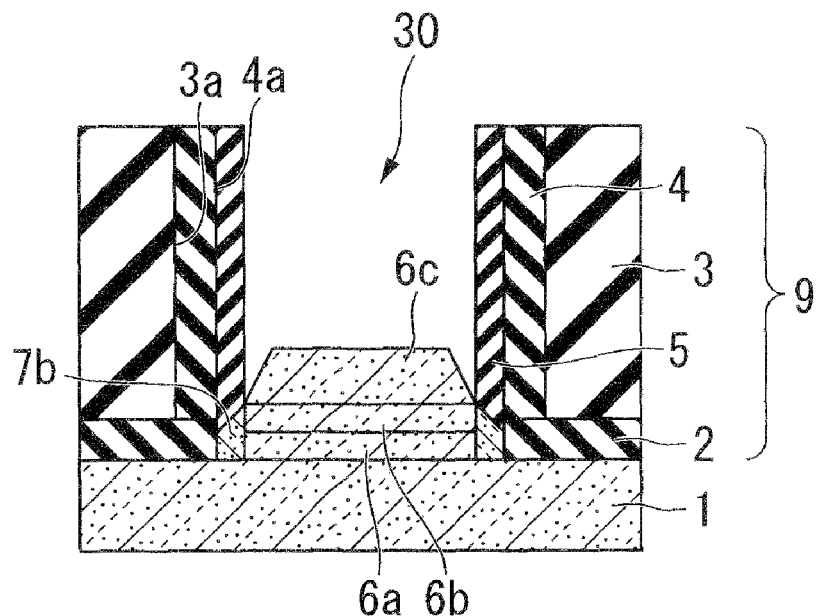

Then, material gas is resupplied to form monocrystalline layers 6c and 7b epitaxially grown respectively on the monocrystalline layer 6b and the pit 50b as shown in FIG. 9. The monocrystalline layer 7b epitaxially grown on the pit 50b contacts the substitutional sidewall 5, and thereby includes many defects. On the other hand, the monocrystalline layer 6c epitaxially grown on the monocrystalline layer having few defects 6b includes few defects.

Figure 10:
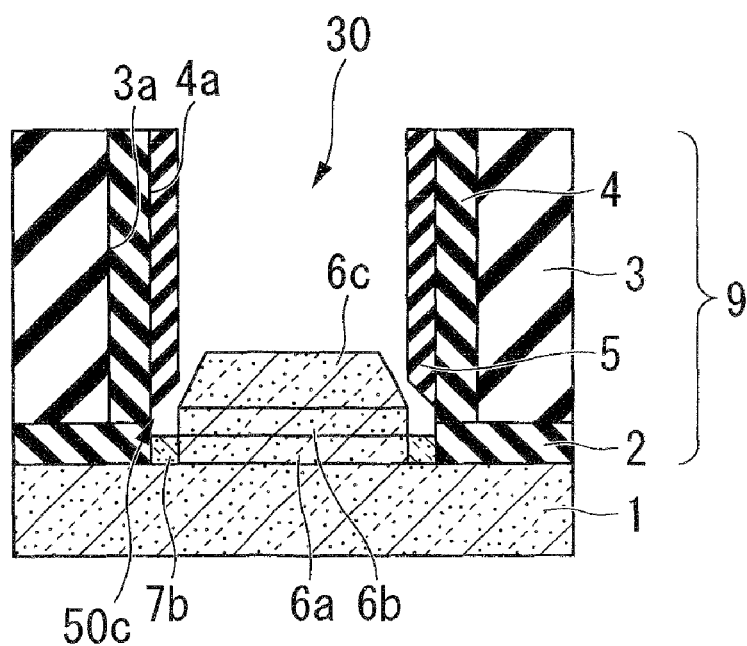

Then, the resupply of material gas is terminated, followed by annealing in a hydrogen atmosphere under the aforementioned conditions to form a new pit 50c as shown in FIG. 10.

Figure 11:
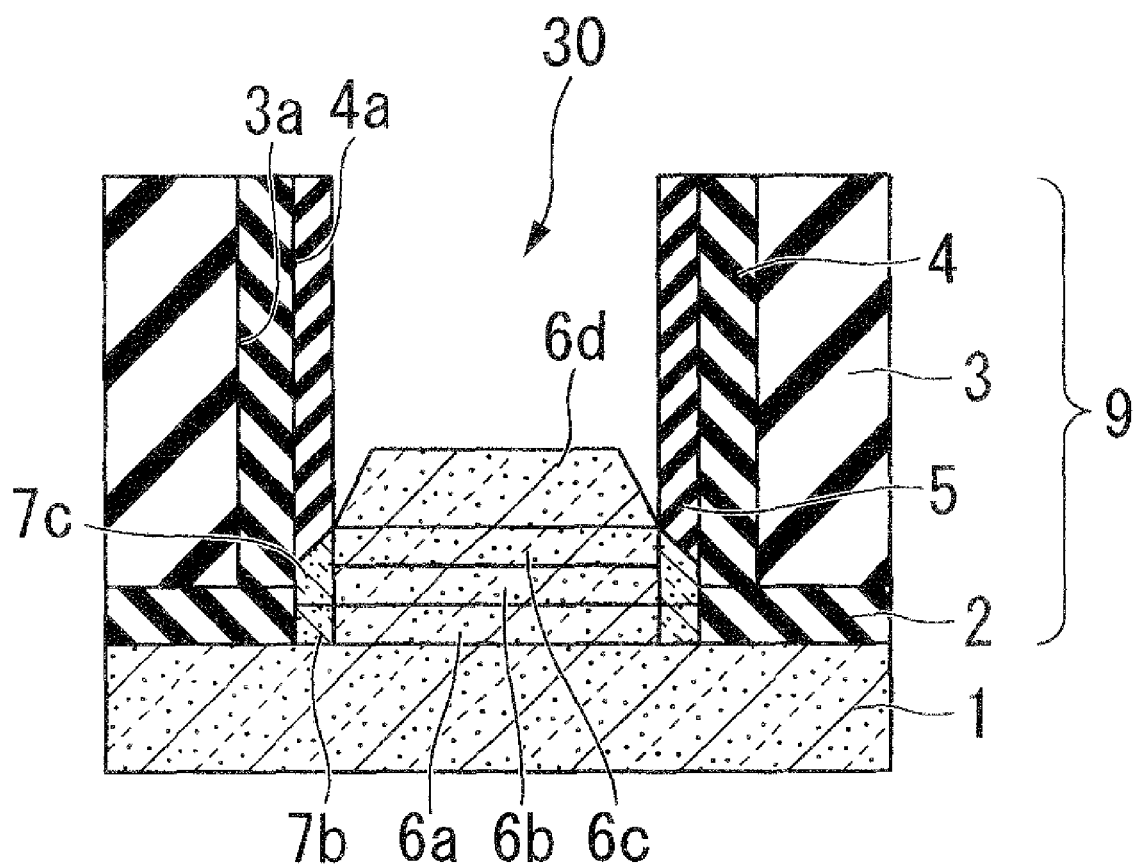

Then, material gas is resupplied to form monocrystalline layers 6d and 7c epitaxially grown respectively on the monocrystalline layer 6c and the pit 50c as shown in FIG. 11. The monocrystalline layer 7c epitaxially grows on the pit 50c and contacts the substitutional sidewall 5, and thereby includes many defects. On the other hand, the monocrystalline layer 6d epitaxially grows on the monocrystalline layer having few defects 6c and includes few defects.

Figure 12A:
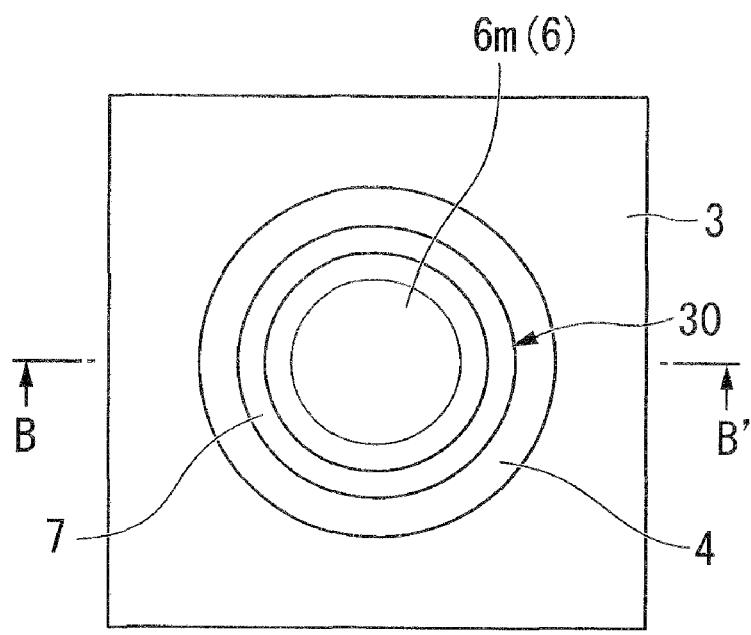
Figure 12B:
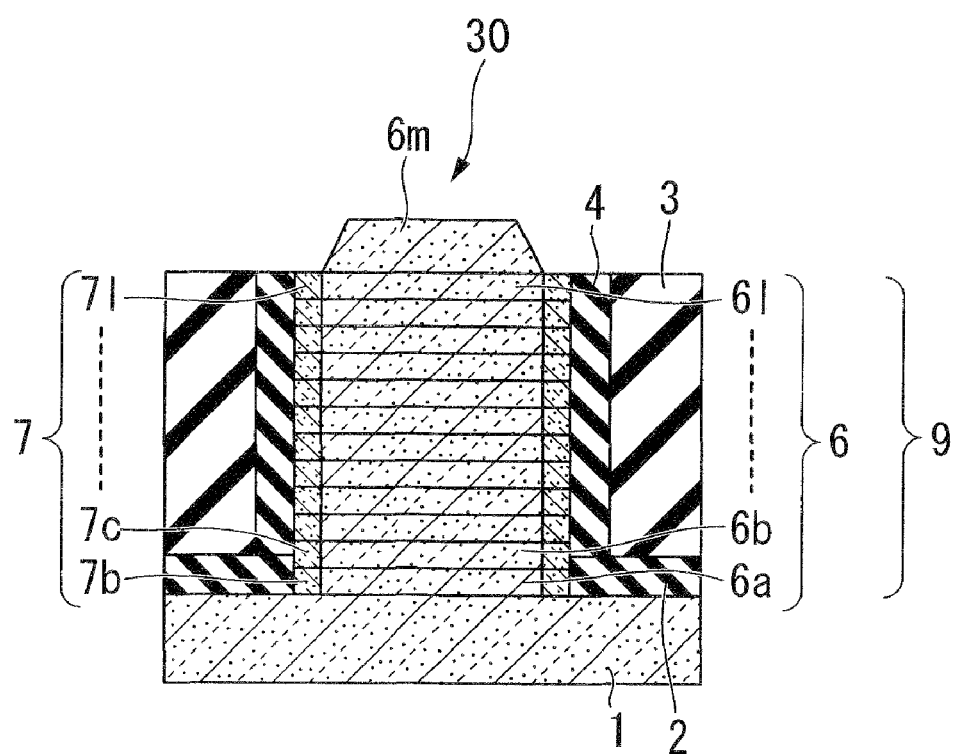

By repetition of annealing in a reduced atmosphere and epitaxial growth in this manner, the monocrystalline layer having few defects 6 including the monocrystalline layer 6m protruding from the inter-layer film 9 can be formed as shown in FIG. 12B. Instead of the substitutional sidewall 5, the monocrystalline layer having many defects 7 is formed between the sidewall 4 and the monocrystalline layer having few defects 6.

FIG. 12A is a plane view illustrating the structure of the monocrystalline layer having few defects 6. FIG. 12B is a cross-sectional view taken along a line B-B' shown in FIG. 12A.

As shown in FIG. 12A, the sidewall 4, the monocrystalline layer having many defects 7, and the monocrystalline layer having few defects 6 are formed inside the circular contact hole 30 provided in the inter-layer film 3 made of an oxide film.

As shown in FIG. 12B, the inter-layer film 9 including the nitride film 2 and the oxide film 3 is formed on the monocrystalline substrate 1, and the contact hole 30 is formed to penetrate the inter-layer film 9. The sidewall 4 is formed on the inner surface 3a of the contact hole 30. The monocrystalline layer having many defects 7 is formed to cover the sidewall 4. The monocrystalline layer having few defects 6 is formed by 13 monocrystalline layers 6a to 6m sequentially deposited to fill the contact hole 30 on the exposed surface 1a of the monocrystalline substrate 1.

The 12 monocrystalline layers 6a to 6l are substantially equal in thickness. The monocrystalline layer 6m has a cross-sectional surface in a substantially trapezoidal shape and is protruding from the inter-layer film 3 as the protruding portion 6m.

The monocrystalline layers 6a to 6m are sequentially deposited such that each monocrystalline layer is a seed layer for the following layer to be deposited thereon. Since the first monocrystalline layer 6a is formed as a layer having few defects, all of the monocrystalline layers 6a to 6m are layers having few defects. Therefore, the monocrystalline layer 6 includes few defects.

Although the monocrystalline layer having few defects 6 is formed by the 13 monocrystalline layers 6a to 6m, the number of monocrystalline layers is not limited hereto, and may appropriately be changed based on, for example, the size of the contact hole 30.

The monocrystalline layer 6 includes few defects, and therefore can be used as a contact. The monocrystalline layer 7 includes many defects. At this stage, the silicon oxide film used as the substitutional sidewall 5 is removed, and the monocrystalline having many defects 7 is in contact with the sidewall 4.

Figure 13:
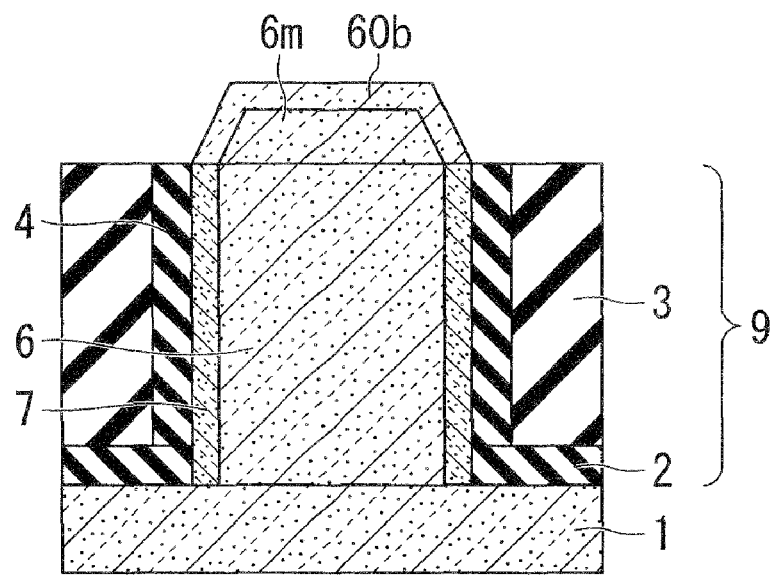

Then, material gas is supplied for the monocrystalline layer having few defects 60b to epitaxially grow with the monocrystalline layer 6m protruding from the inter-layer film 9 as a seed layer, as shown in FIG. 13. The monocrystalline layer 60b epitaxially grown on the monocrystalline layer having few defects 6m is a monocrystalline silicon layer of good quality including few defects.

Then, the supply of material gas is terminated, followed by annealing in a hydrogen atmosphere under the aforementioned conditions to form a new pit at a contact portion between the silicon oxide film 3 and the monocrystalline layer.

Figure 14:
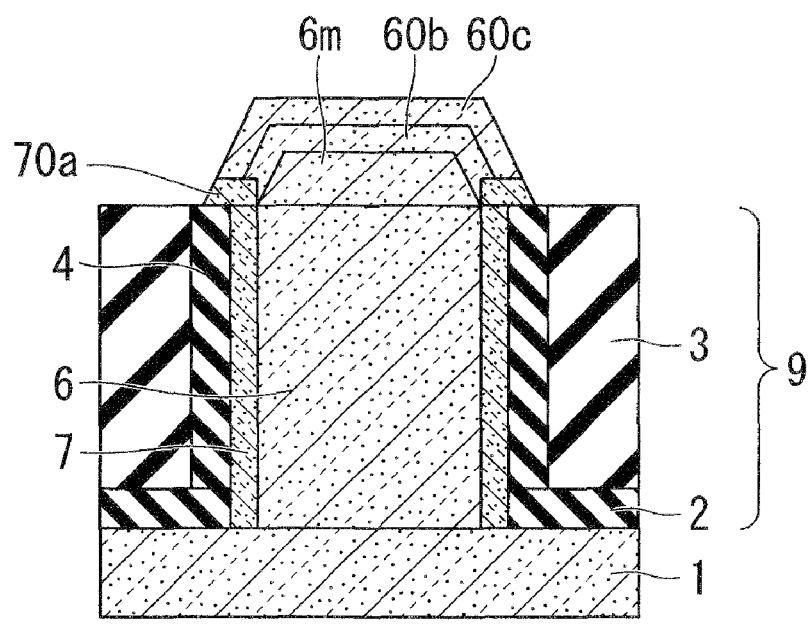

Then, material gas is resupplied for monocrystalline layers 60c and 70a to epitaxially grow respectively on the monocrystalline layer 60b and the pit, as shown in FIG. 14. The monocrystalline layer 70a epitaxially grown on the pit contacts the substitutional sidewall 4 and the silicon oxide film 3, and thereby includes many defects. On the other hand, the monocrystalline layer 60c epitaxially grown on the monocrystalline layer having few defects 60b is a monocrystalline silicon layer of good quality including few defects.

By multiple repetition of annealing in a reduced atmosphere and epitaxial growth in this manner, the monocrystalline layer having many defects 70 covering the inter-layer film 9 and the monocrystalline layer having few defects 60 epitaxially grown on the monocrystalline layer 70 so as to be connected to the monocrystalline layer having few defects 6 are formed as shown in FIG. 15. Thereby, the contact 11 is completed.

The monocrystalline layer 60 is made of monocrystalline silicon including few defects, and therefore can be used as a monocrystalline layer for forming an element, such as a transistor. The monocrystalline layer 70 is made of monocrystalline silicon including many defects.

In the epitaxial growth process, an impurity is preferably implanted into the monocrystalline layer by in-situ doping, so that a semiconductor element of high performance can be formed.

In the epitaxial growth process, the monocrystalline layer is preferably made of a monocrystalline silicon layer or a monocrystalline SiGe layer, so that a monocrystalline layer including few defects can effectively be formed.

Before the inter-layer film 9 is formed on the monocrystalline substrate 1, the monocrystalline substrate 1 is preferably dug by 0.1 to 20 nm so that an impurity on the surface of the monocrystalline substrate 1 can be removed, and defects of the monocrystalline layer to be epitaxially grown can be reduced.

Before the epitaxial growth process, annealing in a reduced atmosphere is preferably carried out so that an impurity on the surface can be removed, and defects of the monocrystalline layer to be epitaxially grown can be reduced.

According to the method of manufacturing the semiconductor device of the first embodiment, the monocrystalline layers 6a to 6m are epitaxially grown while contact portions between the substitutional sidewall 5 and the monocrystalline layers 6a to 6l are removed by sublimation to accordingly form pits in annealing in a reduced atmosphere. Further, the monocrystalline layers 60b, 60c, and the like are epitaxially grown by repetition of annealing in a reduced atmosphere and epitaxial growth with the monocrystalline layer having few defects 6m as a seed layer. Thereby, a surface to be epitaxially grown is always prevented from contacting the silicon oxide film 5, and the monocrystalline layers 6 including few defects can be formed.

Second Embodiment

Hereinafter, a second embodiment of the present invention is explained.

Figure 16:
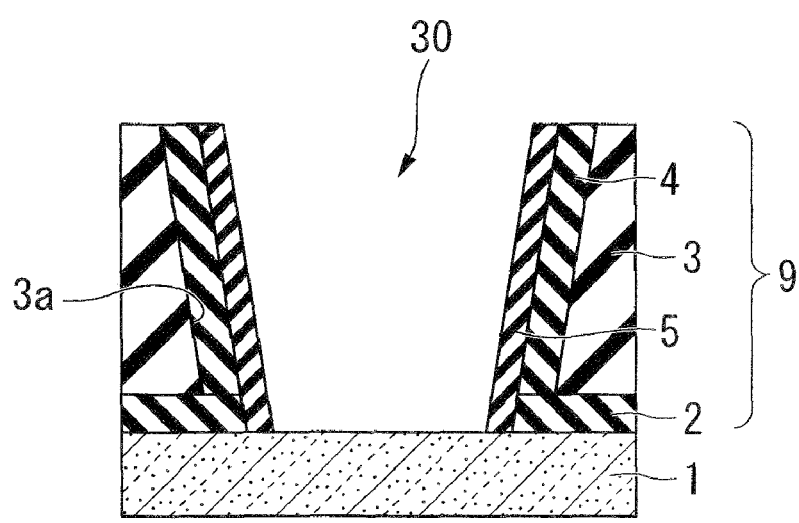
FIG. 16 illustrates a semiconductor device according to a second embodiment of the present invention.

FIG. 16 is a cross-sectional view illustrating a substrate of a semiconductor device according to the second embodiment of the present invention when the inter-layer film 9 including the silicon nitride film 2 and the silicon oxide film 3 is formed on the monocrystalline substrate 1, followed by dry-etching the silicon oxide film 3 and the silicon nitride film 2 to form the contact hole 30 partially exposing the surface 1a of the monocrystalline substrate 1.

The inner surface 3a of the contact hole 30 is formed in a taper shape so that the opening is gradually narrower toward the monocrystalline substrate 1. Thus, the inner surface 3a of the contact hole 30 may not be perpendicular to the surface 1a of the monocrystalline substrate 1.

Third Embodiment

Hereinafter, a third embodiment of the present invention is explained.

Figure 17:
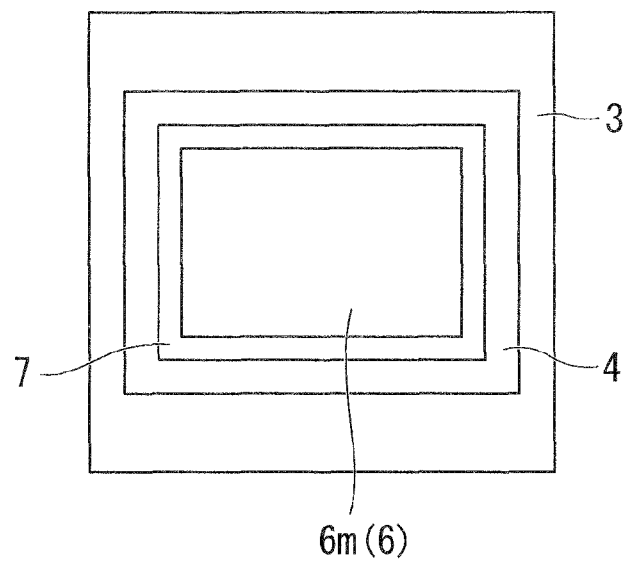
FIG. 17 illustrates a semiconductor device according to a third embodiment of the present invention.

FIG. 17 is a plane view illustrating a substrate of a semiconductor device according to the third embodiment of the present invention when the monocrystalline layer having few defects 6 including the monocrystalline layer 6m protruding from the inter-layer film 9 is formed by repetition of annealing in a reduced atmosphere and epitaxial growth.

Thus, the shape of the contact hole 30 is not limited, and may be substantially rectangular. In this case, the monocrystalline layer of few defects 6 to be used as a contact is also in a substantially rectangular shape.

Fourth Embodiment

Hereinafter, a fourth embodiment of the present invention is explained.

Figure 23:
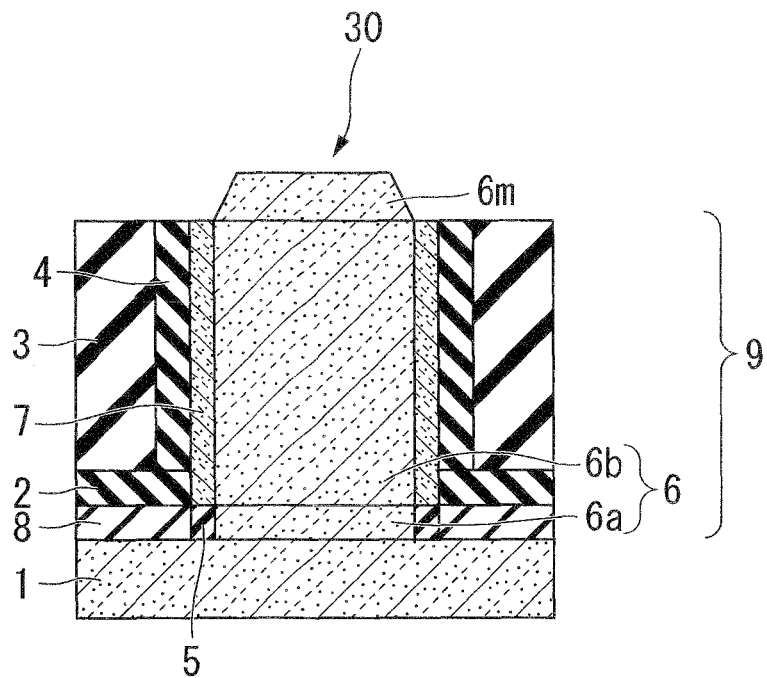

FIG. 23 is a cross-sectional view illustrating a substrate of a semiconductor device according to the fourth embodiment when the monocrystalline layer having few defects 6 including the monocrystalline layer 6m protruding from the inter-layer film 9 is formed by repetition of annealing in a reduced atmosphere and epitaxial growth.

The difference from the first embodiment is only that the inter-layer film 9 formed on the monocrystalline substrate 1 includes a silicon oxide film 8, the silicon nitride film 2, and the silicon oxide film 3, and that the substitutional sidewall 5 remains between the silicon oxide film 8 and the monocrystalline layer having few defects 6. Like reference numerals represent like elements of the first embodiment.

Hereinafter, a method of manufacturing the semiconductor device according to the fourth embodiment is explained.

Figure 18:
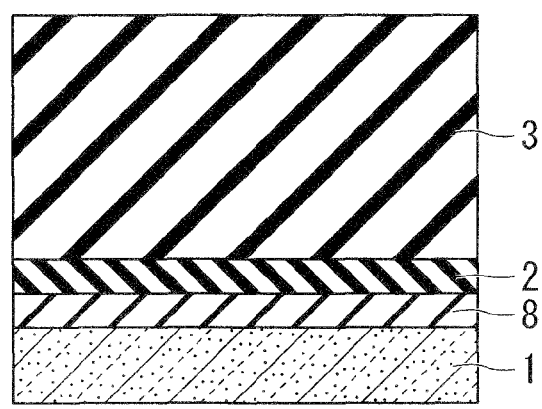
FIGS. 18 to 23 illustrate process flow of a method of manufacturing a semiconductor device according to a fourth embodiment of the present invention.

As shown in FIG. 18, the silicon oxide film 8 is deposited on the monocrystalline substrate 1 made of silicon by thermal treatment. Then, the silicon nitride film 2 having a thickness of, for example, 10 nm is deposited on the silicon oxide film 8. Then, the silicon oxide film 3 having a thickness of, for example, 200 nm is deposited by CVD on the silicon nitride film 2.

Figure 19:
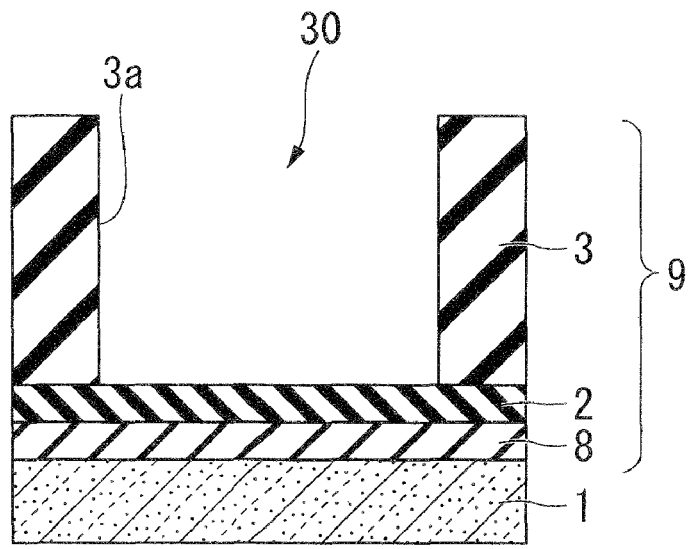

Then, anisotropic dry etching is carried out on the silicon oxide film 3 with a photoresist film including openings as a mask to form the contact hole 30 in the silicon oxide film 3 as shown in FIG. 19. Thereby, the silicon nitride film 2 is partially exposed to the contact hole 30. The inner surface 3a of the contact hole 30 is substantially perpendicular to the monocrystalline substrate 1.

Figure 20:
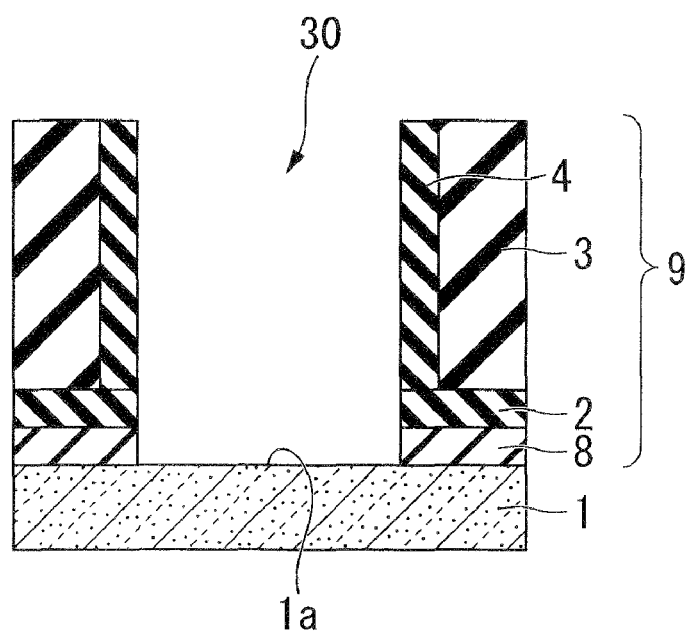

Then, a silicon nitride film having a thickness of, for example, 10 nm is deposited by CVD over the entire surface, followed by dry etching to form the sidewall 4 made of the silicon nitride film on the inner surface 3a of the contact hole 30, as shown in FIG. 20. As a result, the upper surface 1a of the monocrystalline substrate 1 is partially exposed to the contact hole 30.

Figure 21:
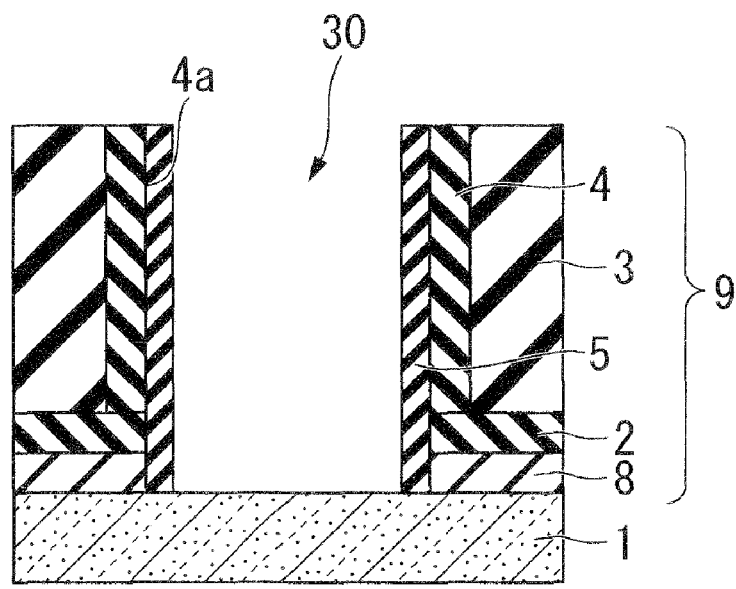

Then, a silicon oxide film having a thickness of, for example, 10 nm is deposited by CVD over the entire surface, followed by dry etching to form the substitutional sidewall 5 made of the silicon oxide film on the inner surface 4a of the sidewall 4, as shown in FIG. 21. As a result, the upper surface 1a of the monocrystalline substrate 1 is partially exposed to the contact hole 30.

Then, the exposed surface 1a of the monocrystalline substrate 1 is cleansed by, for example, a wet process such as organic solvent cleaning or a dry process such as ozone cleaning.

Figure 22:
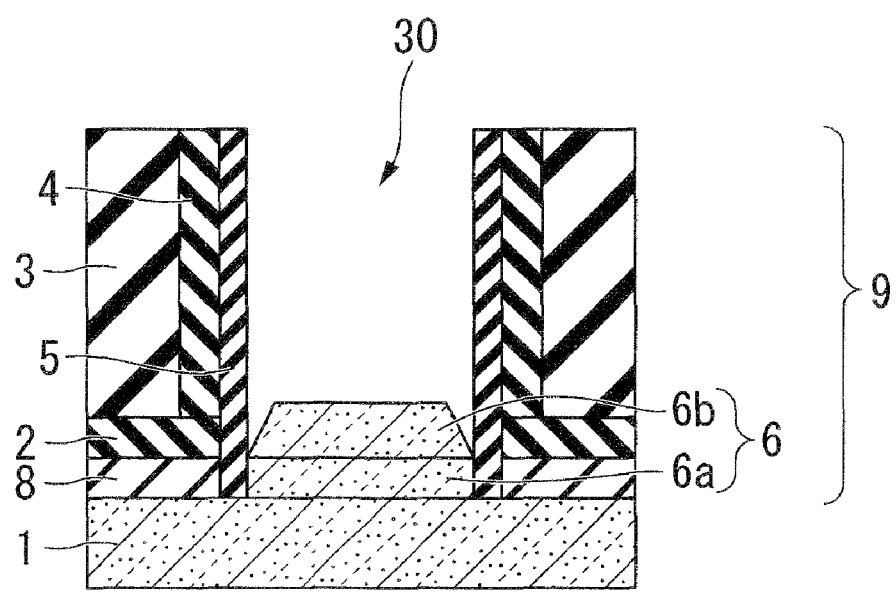

Then, the monocrystalline layer 6a made of silicon is formed on the exposed surface 1a of the monocrystalline substrate 1 by epitaxial growth using an epitaxial growth apparatus, as shown in FIG. 22. The epitaxial growth is carried out at 800° C. in a hydrogenous atmosphere with dichlorosilane supplied at 200 cc/min and hydrogen chloride supplied at 100 cc/min. The hydrogenous atmospheric pressure may be smaller than atmospheric pressure.

The monocrystalline layer 6a is substantially equal to the silicon oxide film 8 in thickness and includes few defects. Sequentially, the monocrystalline layer 6b is epitaxially grown on the monocrystalline layer 6a under the same conditions.

The monocrystalline layer 6b is preferably formed such that a side portion thereof in contact with the substitutional sidewall 5 is as small as possible. If the contact portion is small, lattice mismatch between the monocrystalline layer 6b and the substitutional sidewall 5 does not have a significant effect, preventing defects of the monocrystalline layer 6b. If the contact portion is large, lattice mismatch therebetween has a large effect, causing many defects in the monocrystalline layer 6b.

Then, the supply of the material gas for the epitaxial growth is terminated, followed by annealing in a reduced atmosphere. The annealing can be carried out in, for example, a 100% hydrogen atmosphere. As a result, a contact portion between the monocrystalline substrate 1 and the substitutional sidewall 5 made of a silicon oxide film is removed, thereby forming a pit.

By repetition of annealing in a reduced atmosphere and epitaxial growth, the monocrystalline layer having few defects 6 including the monocrystalline layer 6m protruding from the inter-layer film 9 can be formed as shown in FIG. 23. Instead of the substitutional sidewall 5, the monocrystalline layer 7 having many defects is formed between the sidewall 4 and the monocrystalline layer having few defects 6.

Additionally, the inter-layer film 9 formed on the monocrystalline substrate 1 includes the silicon oxide film 8, the silicon nitride film 2, and the silicon oxide film 3. The substitutional sidewall 5 remains between the silicon oxide film 8 and the monocrystalline layer having few defects 6.

Thus, the inter-layer film 9 may include three layers. A condition required for monocrystalline layers including few defects being deposited up to the surface of the inter-layer film 9 is only that a silicon oxide film covers the inner surface 3a of the contact hole 30. Therefore, other processes can be modified.

Fifth Embodiment

Hereinafter, a fifth embodiment of the present invention is explained.

Figure 24:
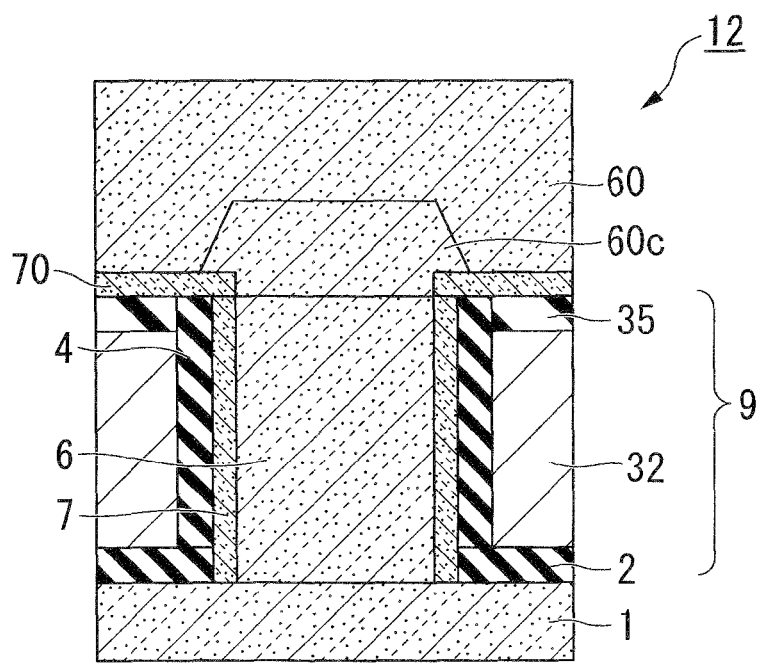
FIG. 24 illustrates a semiconductor device according to a fifth embodiment of the present invention.

FIG. 24 is a cross-sectional view illustrating a contact 12 included in a semiconductor device according to the fifth embodiment of the present invention. The difference from the first embodiment is only that the inter-layer film 9 includes the nitride film 2, a protect insulating film 35 such as a silicon oxide film, and a non-insulating film 32. Like reference numerals represent like elements of the first embodiment.

The nitride film 2 is formed on the surface 1a of the monocrystalline substrate 1, followed by sequentially forming the thick non-insulating film 32 and the protect insulating film 35 in this order on the silicon nitride film 2.

The non-insulating film 32 can be made of any material, such as silicon, silicon compound, or a low-resistance material, such as metal or metal compound. The protect insulating film 35 is formed to cover the surface of the non-insulating film 32 so that silicon does not epitaxially grow when the non-insulating film 32 is made of a low-resistance material.

According to the semiconductor device of the fifth embodiment, the contact 12 includes the inter-layer film 9 including the nitride film 2, the protect insulating film 35, and the non-insulating film 32. Thereby, the substrate can be formed at a portion made of a metal material, such as wirings, enabling enhancement of utility as a substrate including monocrystalline layers.

Sixth Embodiment

Hereinafter, a sixth embodiment of the present invention is explained.

Figure 25A:
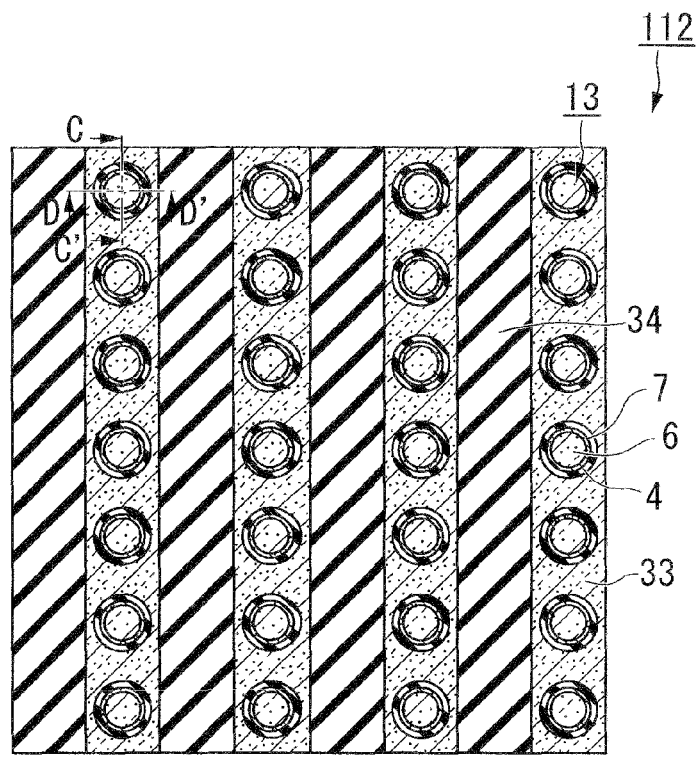
FIGS. 25A, 25B, and 25C illustrate a semiconductor device according to a sixth embodiment of the present invention.
Figure 25B:
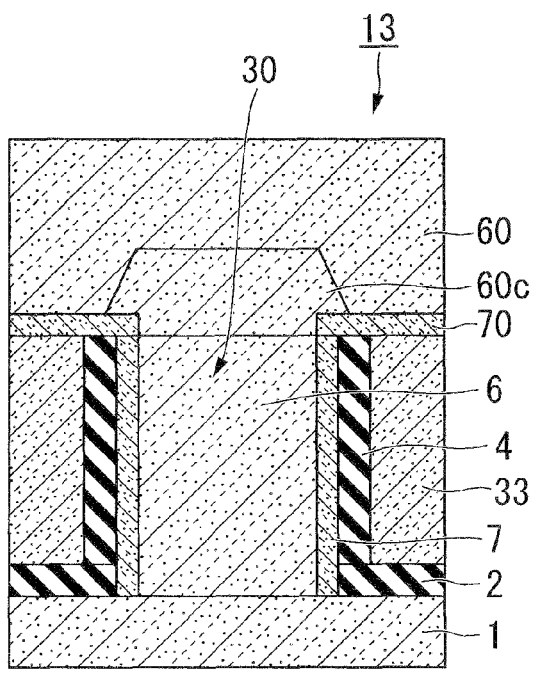
Figure 25C:
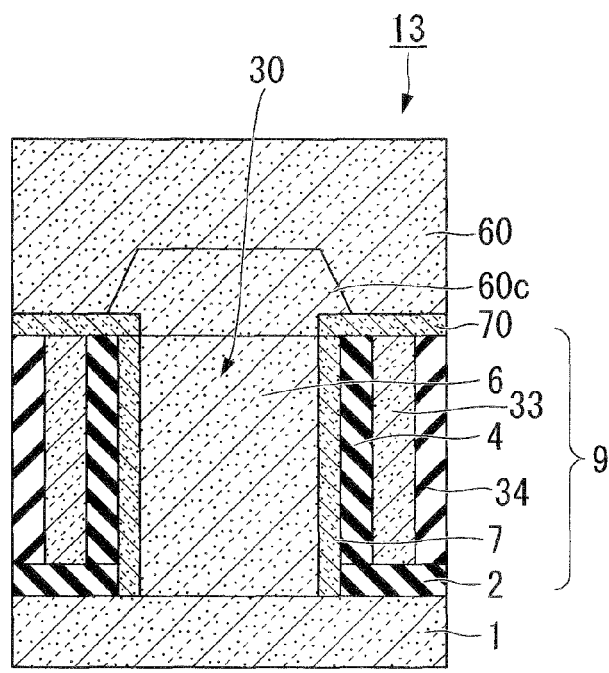

FIG. 25A is a plan view illustrating a substrate 112 of a semiconductor device according to a sixth embodiment of the present invention. FIGS. 25B and 25C are cross-sectional views respectively taken along lines C-C' and D-D' shown in FIG. 25A.

As shown in FIG. 25A, the substrate 112 includes wirings made of DOPOS (doped polycrystalline silicon) 33 and the oxide film 34 formed in line-and-space patterns. Multiple circular contacts 13 are regularly formed in the wirings made of DOPOS 33. The contact 13 includes a sidewall 4 made of a nitride film and the monocrystalline layer having many defects 7 that are formed on the inner surface of the contact hole 30, and the monocrystalline layer having few defects 6 filling the contact hole 30.

As shown in FIG. 25B, the difference from the first embodiment is only that the inter-layer film 9 of the contact 13 includes the silicon nitride film 2 and the DOPOS 33.

As shown in FIG. 25C, the difference from the first embodiment is only that the inter-layer film 9 of the contact 13 includes the silicon nitride film 2, the DOPOS 33, and the oxide film 34. The DOPOS 33 is between the sidewall 4 and the oxide film 34.

Thus, multiple contact holes 30 for forming the monocrystalline layer having few defects 6 may be formed on a wafer.

Multiple wirings made of the DOPOS 33 are provided in the inter-layer film 9 such that any one of the wirings is connected to a memory, and thereby the substrate 112 can be used as a memory-type semiconductor device.

Seventh Embodiment

Hereinafter, a seventh embodiment of the present invention is explained.

Figure 26A:
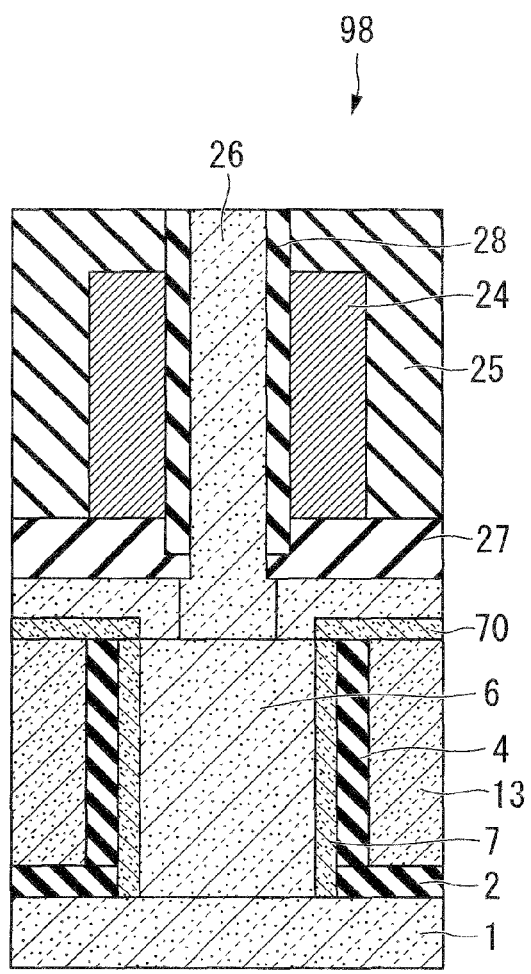
FIGS. 26A and 26B illustrate a semiconductor device according to a seventh embodiment of the present invention.

FIG. 26A is a cross-sectional view taken along the line C-C' shown in FIG. 25A when a vertical MOSTr (metal oxide semiconductor transistor) 98 is formed on the monocrystalline layer having few defects 60 of the contact 13 shown in FIGS. 25A to 25C. FIG. 25B is a cross-sectional view taken along the line D-D' shown in FIG. 25A.

Figure 26B:
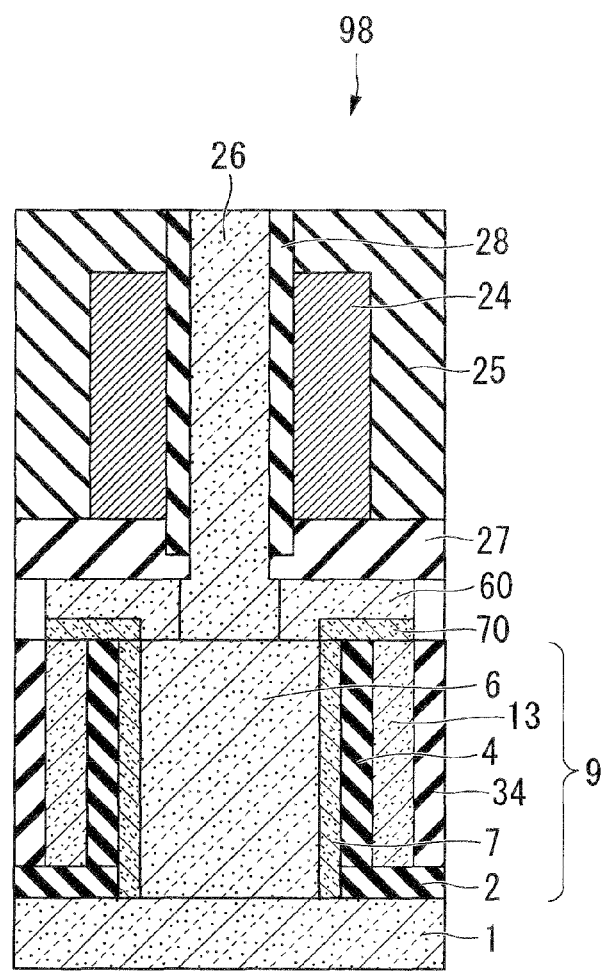

As shown in FIGS. 26A and 26B, the vertical MOSTr 98 is formed in another inter-layer film including the insulating films 25 and 27 formed on the monocrystalline layer having few defects 60 of the contact 13. The vertical MOSTr 98 includes a channel silicon layer 26, an insulating layer 28 surrounding the channel silicon layer 26, a gate electrode 24 surrounding the insulating layer 28, and an insulating film 25 surrounding the gate electrode 24.

The channel silicon layer 26 includes few defects similarly to the monocrystalline layers having few defects 6 and 60, and the bottom end thereof is connected to the monocrystalline layer having few defects 6.

Thus, a transistor may be included in the other inter-layer film on the SOI substrate. Characteristics of the semiconductor device can be enhanced by forming the vertical MOSTr 98 including the channel silicon layer 26 having few defects.

Eighth Embodiment

Hereinafter, an eighth embodiment of the present invention is explained.

FIG. 28 is a cross-sectional view illustrating a semiconductor device 121 according to the eighth embodiment The difference from the first embodiment is only that wirings 71 and transistors 72 are formed in the inter-layer film 9. Like reference numerals represent like elements of the first embodiment.

The semiconductor device 121 includes the contacts 11 each including the monocrystalline layers having few defects 6 and 60. Additionally, the wirings 71 and the transistors are included in the inter-layer film 9. Thereby, the characteristics of the semiconductor device 121 can be stabilized and the reliability thereof can be enhanced.

Ninth Embodiment

Hereinafter, a ninth embodiment of the present invention is explained.

FIG. 29 is a cross-sectional view illustrating a semiconductor device 122 according to the ninth embodiment. The difference from the first embodiment is only that a transistor 72 is formed in the monocrystalline layer having few defects 60 and above the contact 11. Like reference numerals represent like elements of the first embodiment.

According to the semiconductor device 122 of the ninth embodiment, the transistor 72 is formed in the monocrystalline layer having few defects 60. Thereby, the electronic characteristics of the semiconductor device 122 can be stabilized and the reliability thereof can be enhanced.

Additionally, the transistor 72 can be formed as a thin-film transistor while the monocrystalline layer having few defects 60 is a thin film. Thereby, higher density of the semiconductor device is enabled.

Further, the thin-film transistor 72 can be formed in the monocrystalline thin-film layer having few defects 60 and above the contact 11. Thereby, accumulated holes causing variation in characteristics of the thin-film transistor 72 can flow into the monocrystalline substrate 1 through the defects included in the monocrystalline layer having many defects 7 formed on the inner surface 3a of the contact hole 30, preventing the floating effect of the substrate.

Tenth Embodiment

Hereinafter, a tenth embodiment of the present invention is explained.

Figure 30:
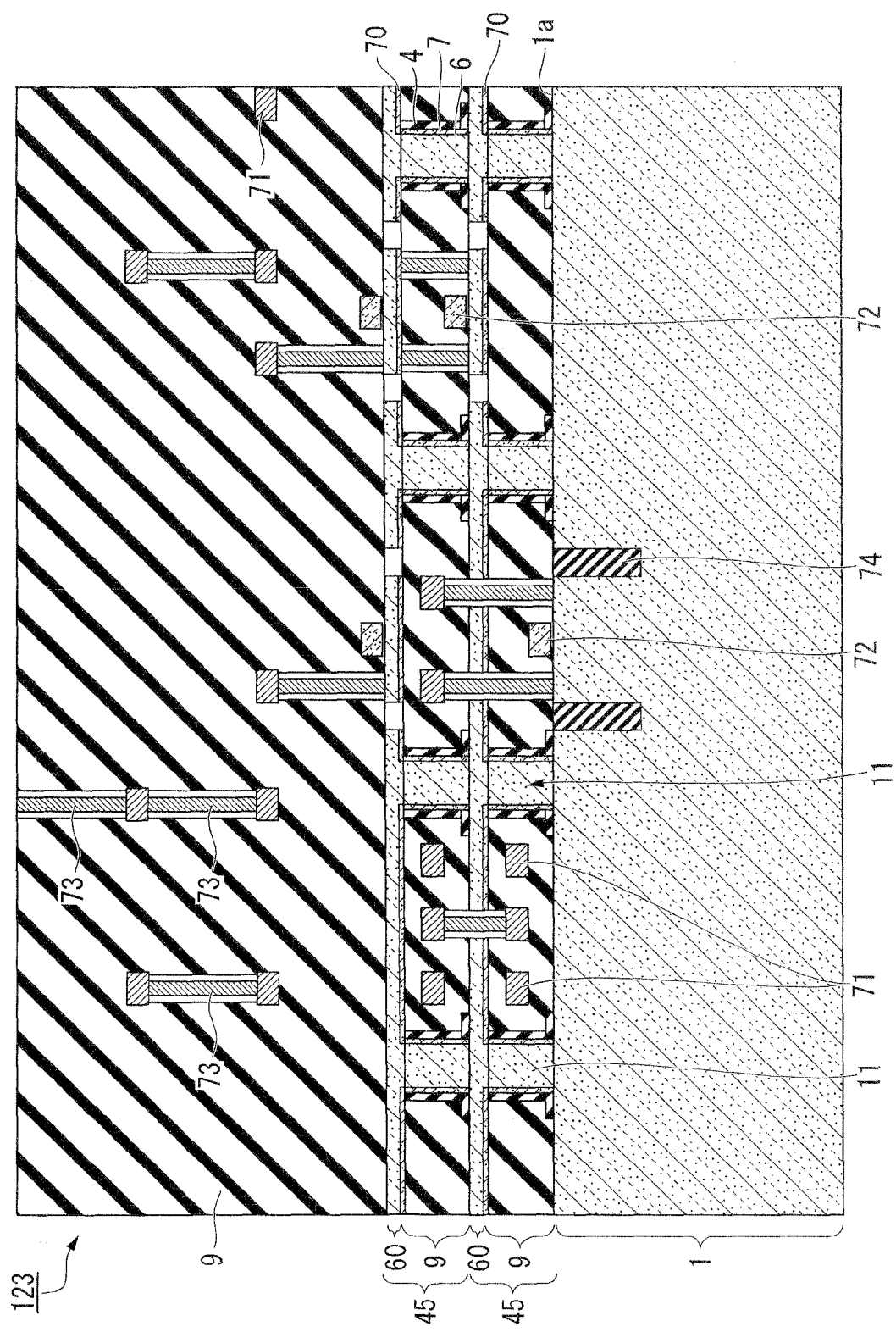
FIG. 30 illustrates a semiconductor device according to a tenth embodiment of the present invention.

FIG. 30 is a cross-sectional view illustrating a multilayered semiconductor device 123 according to the tenth embodiment. Like reference numerals represent like elements of the first embodiment.

The semiconductor device 123 includes two contact-included layers 45 and the inter-layer film 9 deposited thereon. Each of the contact-included layers 45 includes the inter-layer film 9, the monocrystalline layer having many defects 70, and the monocrystalline layer having few defects 60.

Two isolation recesses 74 are formed in the monocrystalline substrate 1. The three wirings 71, the transistor 72, and vertical wirings 73 are included in the first inter-layer film 9 on the monocrystalline substrate 1. The vertical wirings 73 connect the two wirings 71 formed in the second inter-layer film 9 to the monocrystalline substrate 1.

The three wirings 71 formed between a pair of the contacts 11, and the two wirings 71, the transistor 72, and the two vertical wirings 73 which are formed between another pair of the contacts 11, are formed in the second inter-layer film 9.

Further, the nine wirings 71, the six vertical wirings 73, and the two transistors 72 are formed in the third inter-layer film 9. Multiple isolation recesses 74 are formed in the two monocrystalline layers having few defects 60. The multiple contacts 11 are formed to connect the monocrystalline substrate 1 to the two monocrystalline layers having few defects 60.

Even in this structure, the monocrystalline layer 6 formed in the contact 11 and the monocrystalline layer 60 formed on the inter-layer film 9 include few defects. Thereby, the electronic characteristics of the semiconductor device 123 can be stabilized, and the reliability thereof can be enhanced.

The number of the contact-included deposited layers 45 is not limited. Multilayering enables higher density of the semiconductor device.

Hereinafter, annealing in a reduced atmosphere is supplementarily explained. A confirmation experiment for proving that both the silicon and the silicon oxide film at the contact boundary therebetween are sublimed was carried out to check a state of the contact boundary after the annealing in a hydrogenous atmosphere, which is shown in FIGS. 31A and 31B.

Figure 31A:
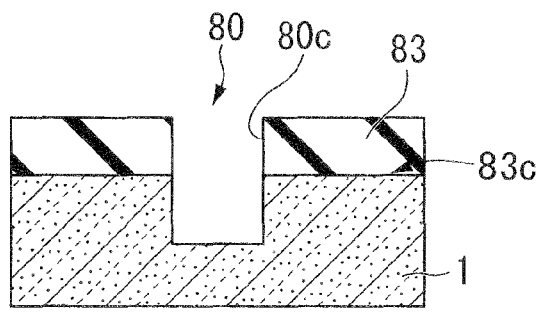
FIGS. 31A and 31B illustrate an effect of annealing in a hydrogenous atmosphere.
Figure 31B:
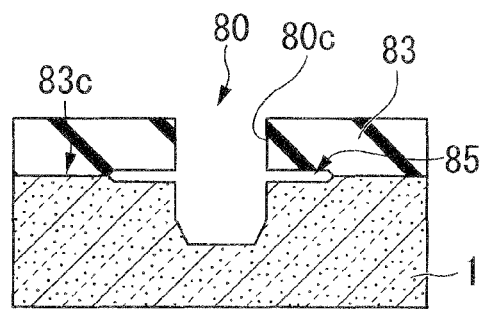
Figure 32A:
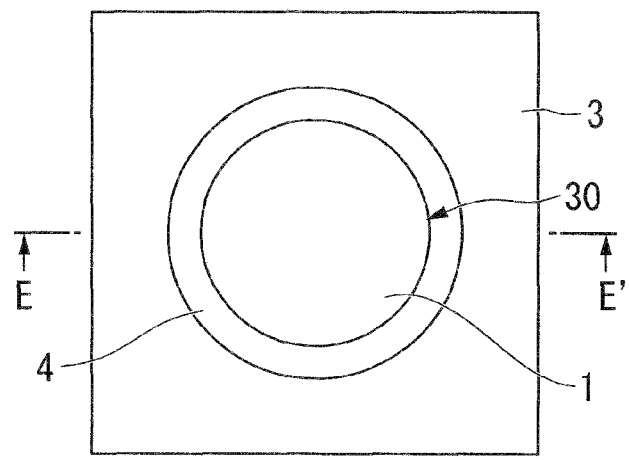
FIGS. 32A, 32B, 33, and 34 illustrate process flow of a method of manufacturing a conventional semiconductor device.
Figure 32B:
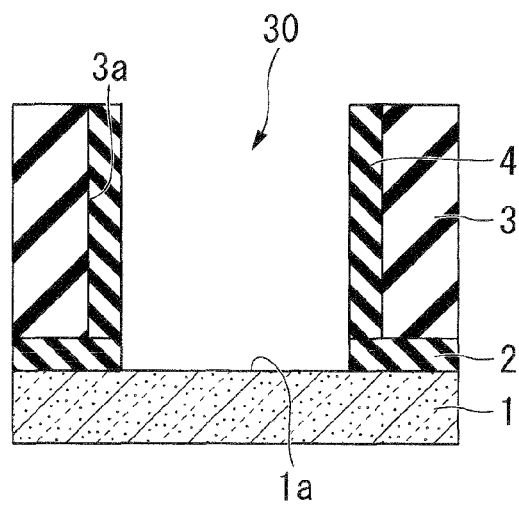
Figure 33:
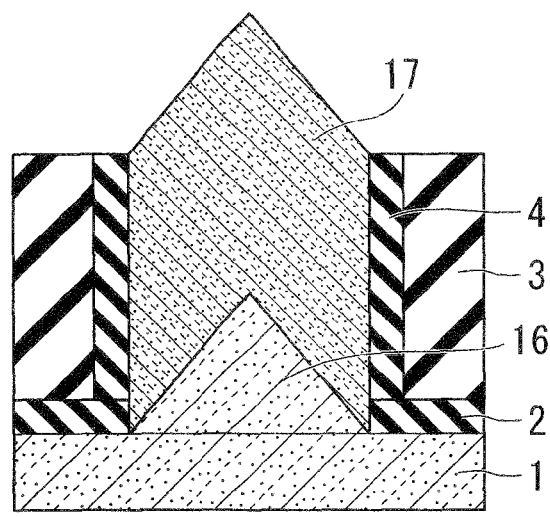
Figure 34:
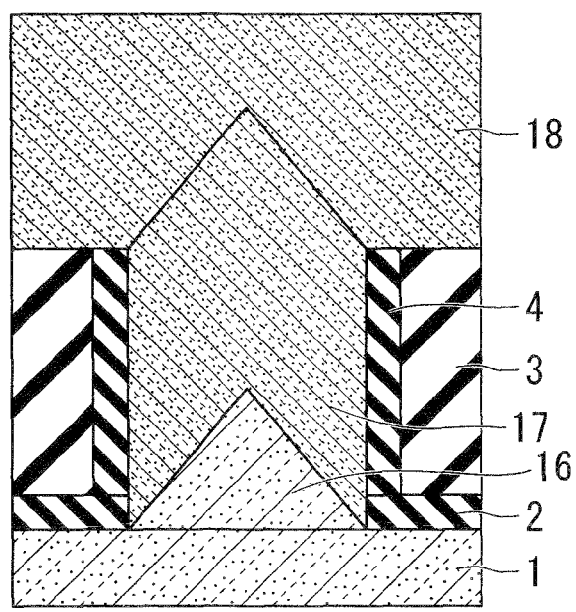

FIG. 31A is a cross sectional view illustrating a state of the contact boundary before annealing in a hydrogenous atmosphere. FIG. 31B is a cross-sectional view illustrating the contact boundary after the annealing in a hydrogenous atmosphere.

As shown in FIG. 31A, the silicon oxide film 83 was formed on the silicon substrate 1 in the experimental sample so that a contact boundary 83c would be formed between the silicon substrate 1 and the silicon oxide film 83. The recess 80 was formed so that the contact boundary 83c would be partially exposed from the inner surface 80c.

In this experiment sample, annealing in a hydrogenous atmosphere was carried out at 800° C. for two minutes. As shown in FIG. 31B, the contact boundary 83c exposed from the inner surface 80c was partially removed, and then a pit 85 was formed. The pit 85 spread along the contact boundary 83c.

The thickness of the pit 85 was approximately 25 nm. Specifically, the thickness of the pit 85 on the side of the silicon oxide film 83 was approximately 15 nm, and the thickness of the pit 85 on the side of the monocrystalline substrate 1 was approximately 10 nm. This thickness did not greatly change even when the annealing condition other than temperature was changed. However, the pit 85 was not formed when the annealing was carried out at temperature equal to or less than 750° C. The longer the processing time of the annealing was, the longer the length of the pit 85 in the direction along the contact boundary 83c was.

As a result, it was found that the shape of the pit 85 is adjustable by adjusting the time and temperature of annealing in a hydrogen atmosphere.

The mechanism of generation of the pit 85 can be explained by that one of two oxygen atoms constituting $SiO_2$ was separated therefrom, reacted with silicon in the silicon substrate 1, and then SiO was formed and sublimed, thereby causing the pit 85 to be formed in either direction.

Since a hydrogenous atmosphere is necessary for generation of the pit 85 and for vapor phase epitaxial growth, repetition of epitaxial growth and annealing in a hydrogenous atmosphere of the present invention is advantageous.

Since silicon continuously grows during epitaxial growth, the pit 85 is not formed even in the hydrogenous atmosphere during epitaxial growth.

Accordingly, a step of supplying material gas for epitaxial growth in a hydrogenous atmosphere and a step of suspending supply of material gas are performed in the present invention. Conditions, such as temperature and time, can be changed for each step according to need.

The present invention is applicable to semiconductor-device manufacturing and utilizing industries.

It is apparent that the present invention is not limited to the above embodiments, but may be modified and changed without departing from the scope and spirit of the invention.

What is claimed is:

1. A semiconductor device, comprising:
a monocrystalline substrate;
an inter-layer film formed on the monocrystalline substrate;
a contact hole penetrating the inter-layer film and partially exposing an upper surface of the monocrystalline substrate;
a sidewall formed on an inner surface of the contact hole;
a plurality of first monocrystalline layers which fill the contact hole and cover the inter-layer film; and
a plurality of second monocrystalline layers which include more defects than those included in the first monocrystalline layers and cover the sidewall and an upper surface of the inter-layer film so as to be sandwiched between the first monocrystalline layers and the inter-layer film.

2. The semiconductor device according to claim 1, wherein the inter-layer film comprises an insulating film.

3. The semiconductor device according to claim 1, wherein the inter-layer film comprises insulating films provided on upper and lower surfaces thereof and a non-insulating film sandwiched between the insulating films.

4. The semiconductor device according to claim 1, wherein the inner surface of the contact hole is perpendicular to the upper surface of the monocrystalline substrate.

5. The semiconductor device according to claim 1, wherein the contact hole has a taper shape so as to be narrower toward the monocrystalline substrate.

6. The semiconductor device according to claim 1, wherein the contact hole has a circular cross-section.

7. The semiconductor device according to claim 1, wherein the contact hole has a substantially rectangular cross-section.

8. The semiconductor device according to claim 1, wherein two or more layers each comprising the inter-layer-film, the first monocrystalline layers, and the second monocrystalline layers are deposited on the monocrystalline substrate.

9. The semiconductor device according to claim 1, wherein at least one of a transistor and a wiring is included in at least one of the inter-layer film and the first monocrystalline layers.

10. The semiconductor device according to claim 1, wherein a plurality of wirings are included in the inter-layer film, any one of the wirings being connected to a memory.

11. The semiconductor device according to claim 9, wherein the transistor is a thin-film transistor.

12. A method of manufacturing a semiconductor device, comprising:
preparing a monocrystalline substrate;
forming an inter-layer film on the monocrystalline substrate;
forming a contact hole penetrating the inter-layer film and partially exposing an upper surface of the monocrystalline substrate;
forming a first sidewall covering an inner surface of the contact hole;
forming a second sidewall covering the first sidewall;
forming a first monocrystalline layer on the partially-exposed upper surface of the monocrystalline substrate by epitaxial growth;
removing a portion of the second sidewall in contact with the monocrystalline substrate and the first monocrystalline layer by annealing in a reduced atmosphere; and
forming, by repeating the epitaxial growth and the annealing in this order multiple times, a plurality of first monocrystalline layers filling the contact hole and covering the inter-layer film, and a plurality of second monocrystalline layers including more defects than those included in the first monocrystalline layers and covering the first sidewall and an upper surface of the inter-layer film so as to be sandwiched between the first monocrystalline layers and the inter-layer film, the second sidewall being removed and replaced with the second monocrystalline layers.

13. The method according to claim 12, further comprising forming two or more films each comprising the inter-layer film, the first monocrystalline layers, and the second monocrystalline layers.

14. The method according to claim 12, wherein the annealing is performed in a hydrogenous atmosphere.

15. The method according to claim 12, wherein an impurity is implanted into the first and the second monocrystalline layers by in-situ doping.

16. The method according to claim 12, wherein the first monocrystalline layer is any one of a monocrystalline silicon layer and a monocrystalline SiGe layer.

17. The method according to claim 12, further comprising digging the monocrystalline substrate by a range of 0.1 to 20 nm before the inter-layer film is formed thereon.

18. The method according to claim 12, further comprising performing annealing in a reduced atmosphere before the epitaxial growth is firstly performed.

19. The method according to claim 12, wherein the inter-layer film comprises an insulating film.

20. The method according to claim 12, further comprising forming at least one of a transistor and a wiring in at least one of the inter-layer film and the first monocrystalline layers formed on the inter-layer film by the epitaxial growth.

* * * * *